(12) United States Patent
Iwamoto et al.

(10) Patent No.: US 10,614,940 B2
(45) Date of Patent: Apr. 7, 2020

(54) SUPERCONDUCTING MAGNET DEVICE

(71) Applicant: Mitsubishi Electric Corporation, Chiyoda-ku (JP)

(72) Inventors: Naoki Iwamoto, Chiyoda-ku (JP); Hajime Tamura, Chiyoda-ku (JP); Tatsuya Inoue, Chiyoda-ku (JP); Ryo Eguchi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 124 days.

(21) Appl. No.: 15/757,662

(22) PCT Filed: May 25, 2016

(86) PCT No.: PCT/JP2016/065422
§ 371 (c)(1),
(2) Date: Mar. 6, 2018

(87) PCT Pub. No.: WO2017/047164
PCT Pub. Date: Mar. 23, 2017

(65) Prior Publication Data
US 2018/0268974 A1 Sep. 20, 2018

(30) Foreign Application Priority Data
Sep. 15, 2015 (JP) .................. 2015-181414

(51) Int. Cl.
*H01F 6/00* (2006.01)
*H01F 6/02* (2006.01)
(Continued)

(52) U.S. Cl.
CPC ............. *H01F 6/02* (2013.01); *G01R 33/288* (2013.01); *G01R 33/3804* (2013.01); *H01F 6/04* (2013.01); *H01F 6/06* (2013.01); *G01R 33/3815* (2013.01)

(58) Field of Classification Search
CPC ................. H01F 6/02; G01R 33/288
(Continued)

(56) References Cited

U.S. PATENT DOCUMENTS 5,065,582 A * 11/1991 Seifert ............... G01R 33/0354
335/216
5,657,634 A 8/1997 Woods
5,828,280 A * 10/1998 Spivey, Jr. ............ F17C 13/025
335/216

FOREIGN PATENT DOCUMENTS

JP 59-139686 A 8/1984
JP 61-095585 A 5/1986
(Continued)

OTHER PUBLICATIONS

International Search Report issued Aug. 16, 2016 in PCT/JP2016/065422, dated May 25, 2016.

*Primary Examiner* — Alexander Talpalatski
(74) *Attorney, Agent, or Firm* — Oblon, McClelland, Maier & Neustadt, L.L.P.

(57) ABSTRACT

A superconducting magnet device with which device breakage caused by a quench can be avoided while helium consumption is reduced. A sheet-like convection-preventing member is disposed at least either above or below a heat transfer member transferring to gaseous helium heat transferred from the outside, so as to cover a helium gas release tube for the gaseous helium, and thus heat exchange performance during transportation is improved. In the case where the quench occurs, the convection-preventing member is lifted upward in the release tube, thereby ensuring to provide a flow path for the gaseous helium and avoiding excessive increase of the internal pressure.

16 Claims, 25 Drawing Sheets

(51) Int. Cl.
*H01F 6/04* (2006.01)
*G01R 33/28* (2006.01)
*H01F 6/06* (2006.01)
*G01R 33/38* (2006.01)
*G01R 33/3815* (2006.01)

(58) Field of Classification Search
USPC .......................................................... 335/216
See application file for complete search history.

(56) References Cited

FOREIGN PATENT DOCUMENTS

| | | |
|---|---|---|
| JP | 62-065389 A | 3/1987 |
| JP | 02-076808 U1 | 6/1990 |
| JP | 03-122516 U | 12/1991 |
| JP | 06-013251 A | 1/1994 |
| JP | 06-163251 A | 6/1994 |
| JP | 09-283324 A | 10/1997 |
| JP | 2007-005573 A | 1/2007 |
| JP | 2007-194258 A | 8/2007 |
| JP | 2008-306020 A | 12/2008 |
| JP | 2010-016081 A | 1/2010 |

\* cited by examiner

Fig. 6
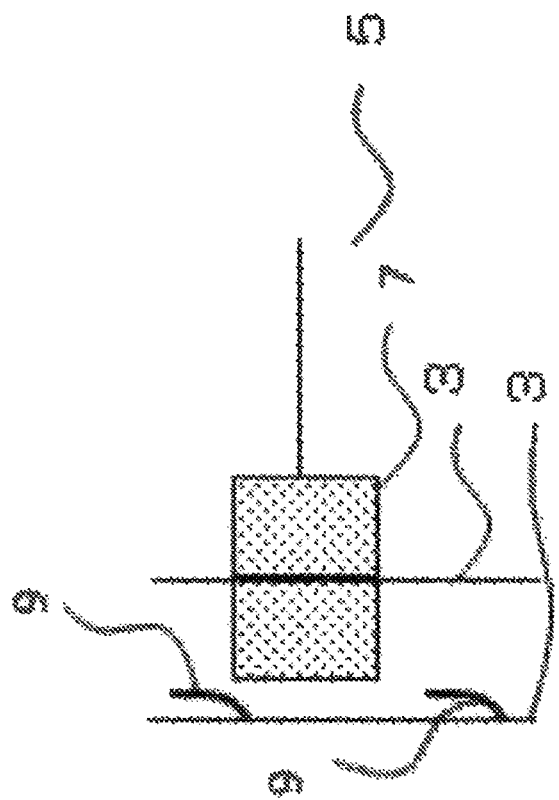
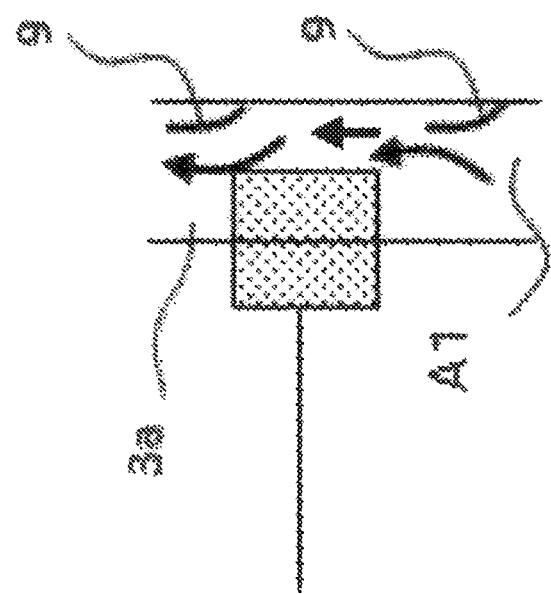

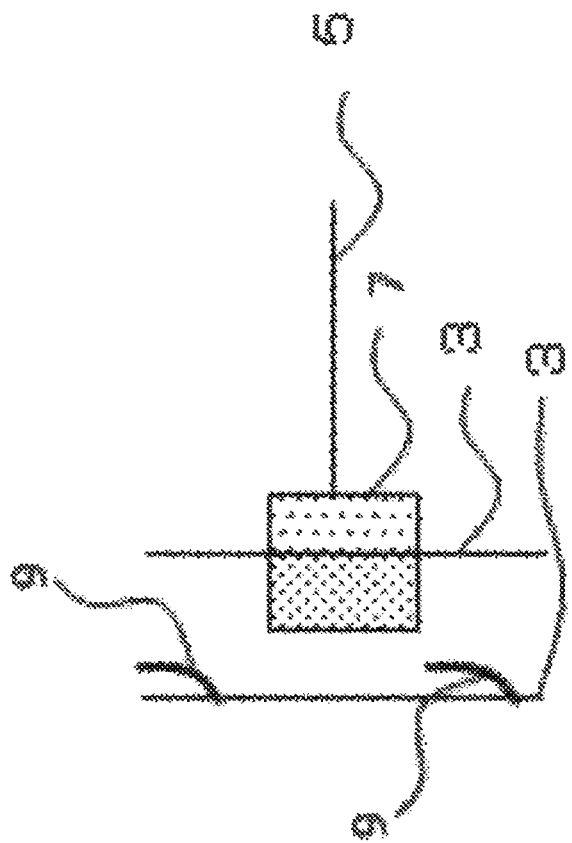
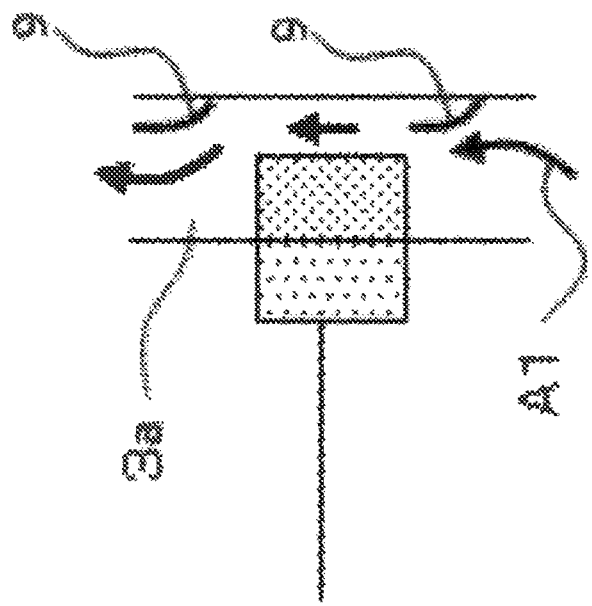
Fig. 10

SUPERCONDUCTING MAGNET DEVICE

TECHNICAL FIELD

The present invention relates to a superconducting magnet device, especially to a superconducting magnet device for MRI which cools a superconducting coil with liquid helium.

BACKGROUND ART

A superconducting magnet device is a device which generates strong magnetic force by applying electric power to a superconducting coil via electrodes. The superconducting coil needs to be cooled to liquid helium temperature in order to eliminate electric resistance of the superconducting coil. In order to generate strong magnetic force by cooling the superconducting coil down to liquid helium temperature, a conventional superconducting magnet device as shown in FIG. 23 includes, for example, a superconducting coil 1, electrodes 8 to supply current to the superconducting coil 1 when energized, and a cryostat 3 made of stainless steel to contain liquid helium 2 for cooling the superconducting coil 1 (for example, Patent Document 1).

When the liquid helium used for cooling evaporates, the volume significantly increases when compared with the liquid helium. Therefore, as shown in FIG. 23, for example, in a conventional superconducting magnet device, the cryostat 3 is provided with a helium gas release tube 3a to release evaporated helium gas to the outside (Patent Document 1).

Temperature outside of the cryostat 3 is higher than its inside temperature. When the heat outside is transferred to the inside of the cryostat 3, it may cause increase in volume due to the evaporation of the liquid helium, and increase in the inside temperature. In order to prevent the inside temperature from rising due to the outside heat, a conventional superconducting magnet device as shown in FIG. 23 includes, for example, a vacuum container 4 to house the cryostat 3, a heat shield 5 made of aluminum having high thermal conductivity to absorb the heat transferring to the vacuum container 4 from the outside, a heat transfer member 7 made of copper to transfer the heat absorbed by the heat shield 5 to gaseous helium 6 passing through the helium gas release tube 3a (for example, Patent Document 1). In the superconducting magnet device with such a configuration as shown in FIG. 24 and FIG. 25, for example, the heat transfer member 7 joined to the helium gas release tube 3a and disposed in a direction crossing the passing direction of the gaseous helium in the helium gas release tube 3a is protruding into the helium gas release tube 3a. The gaseous helium 6 passes through between the heat transfer member 7 and the helium gas release tube 3a from the downside to the upside. When the gaseous helium 6 passing through the helium gas release tube 3a comes into contact with the heat transfer member 7, the heat transferred from the outside and absorbed by the heat shield 5 is transferred to the gaseous helium 6 via the heat transfer member 7, and the gaseous helium 6 with the transferred heat is released to the outside by natural convection (for example, Patent Document 1).

PRIOR ART DOCUMENT

Patent Document

Patent Document 1: Japanese Patent Laid-Open Publication No. 2007-194258

SUMMARY OF THE INVENTION

Problems to be Solved by the Invention

Helium is expensive. Releasing a large amount of the gaseous helium 6 evaporated from the liquid helium 2 may lead to increased maintenance cost for the superconducting magnet device.

In a case different from the normal operating condition, for example, during transportation of the superconducting magnet device, a chiller is stopped. When the chiller is stopped, the liquid helium 2 in the helium gas release tube 3a is likely to evaporate owing to the heat transferred from the outside, which may lead to increase in the maintenance cost of the superconducting magnet device.

In order to reduce the release amount of the gaseous helium 6, a flow path for the gaseous helium 6 in the helium gas release tube 3a may be made narrower. However, when temperature of the superconducting coil 1 is increased owing to some cause, the liquid helium 2 evaporates, resulting in sudden pressure increase in the helium gas release tube 3a. Therefore, in a case where the flow path for the gaseous helium 6 is made narrower in the helium gas release tube 3a, the release of the gaseous helium 6 may not balance the generation of the gaseous helium 6, resulting in the internal pressure increase. Thus, a quench, which causes damage to the superconducting magnet device, may occur.

The present invention is made in consideration of the problems described above, and an object thereof is to provide a superconducting magnet device which can suppress increase in its maintenance cost by reducing the release amount of the gaseous helium and can also prevent the device breakage in the case of the occurrence of the quench by suppressing the pressure increase in the helium gas release tube.

Means for Solving Problem

A superconducting magnet device according to the present invention generates magnetic force when current flows through a superconducting coil via electrodes. The superconducting magnet device includes a vacuum container that houses a superconducting coil and helium to cool the superconducting coil, a heat shield configured to absorb heat transferred from the outside of the vacuum container to the inside thereof, an release tube to release the helium passing in a predetermined direction to the outside, a heat transfer member to transfer the heat absorbed by the heat shield to the helium passing inside the release tube, and convection-preventing members that can at least partly cover inside the release tube in order to prevent the helium from passing through toward the predetermined direction. The electrodes are disposed in the release tube along a predetermined passing direction. The heat transfer member is joined to the release tube along a direction crossing the predetermined passing direction. A part of the heat transfer member protrudes inside the release tube. The convection-preventing members are partly fixed to the tube. The convection-preventing members are disposed away from the heat transfer member along the predetermined passing direction. When the pressure in the tube is within a predetermined value, the convection-preventing members at least partly cover inside the tube, and when the pressure in the tube exceeds the predetermined value, the convection-preventing members at least partly open inside the tube.

Effects of the Invention

A superconducting magnet device according to the present invention has convection-preventing members, which are partly fixed and disposed in the flow path of the release tube. Normally, the convection-preventing members cover the flow path of the release tube to make the flow path be narrow, and thereby the helium is concentrated toward the heat transfer member. However, in the case of pressure increase due to the quench etc., the convection-preventing members do not cover the flow path in the release tube. Therefore, not only reduction in the release amount of the gaseous helium leads to reduction in the maintenance cost of the device, but also concentrating the helium gas toward the release tube in the case where the quench occurs leads to suppression of pressure increase in the release tube to avoid the breakage of the device.

BRIEF DESCRIPTION OF THE DRAWINGS

FIG. 6 is a cross-sectional view of the superconducting magnet device according to Embodiment 1 of the present invention when a quench occurs.

FIG. 10 is a cross-sectional view of the superconducting magnet device according to Embodiment 2 of the present invention when the quench occurs.

EMBODIMENTS FOR CARRYING OUT THE INVENTION

Referring to attached figures, embodiments of the superconducting magnet device disclosed in the present application will be described in detail below. The embodiments shown below are examples and the present invention will not be limited to the embodiments.

Embodiment 1

Figure 1:
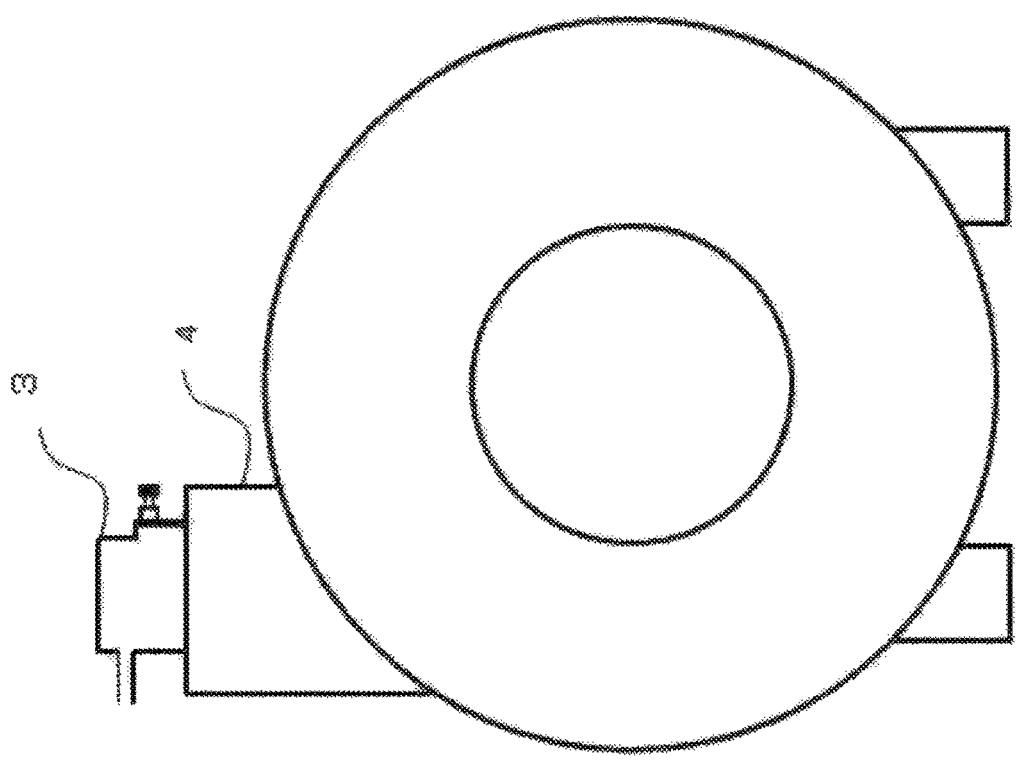
FIG. 1 is a schematic diagram showing a superconducting magnet device according to Embodiment 1 of the present invention.
Figure 2:
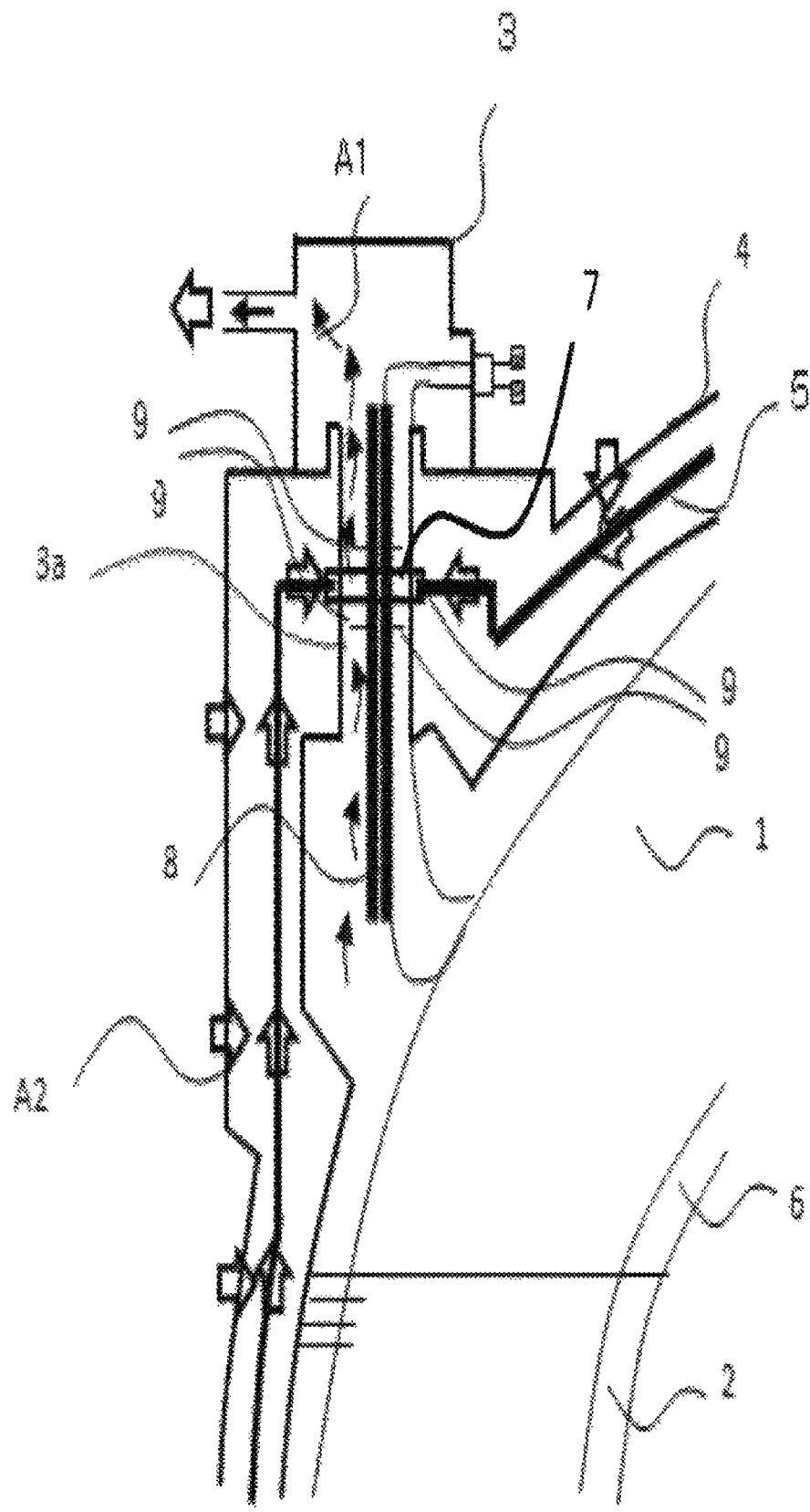
FIG. 2 is a cross-sectional view of the superconducting magnet device according to Embodiment 1 of the present invention.
Figure 3:
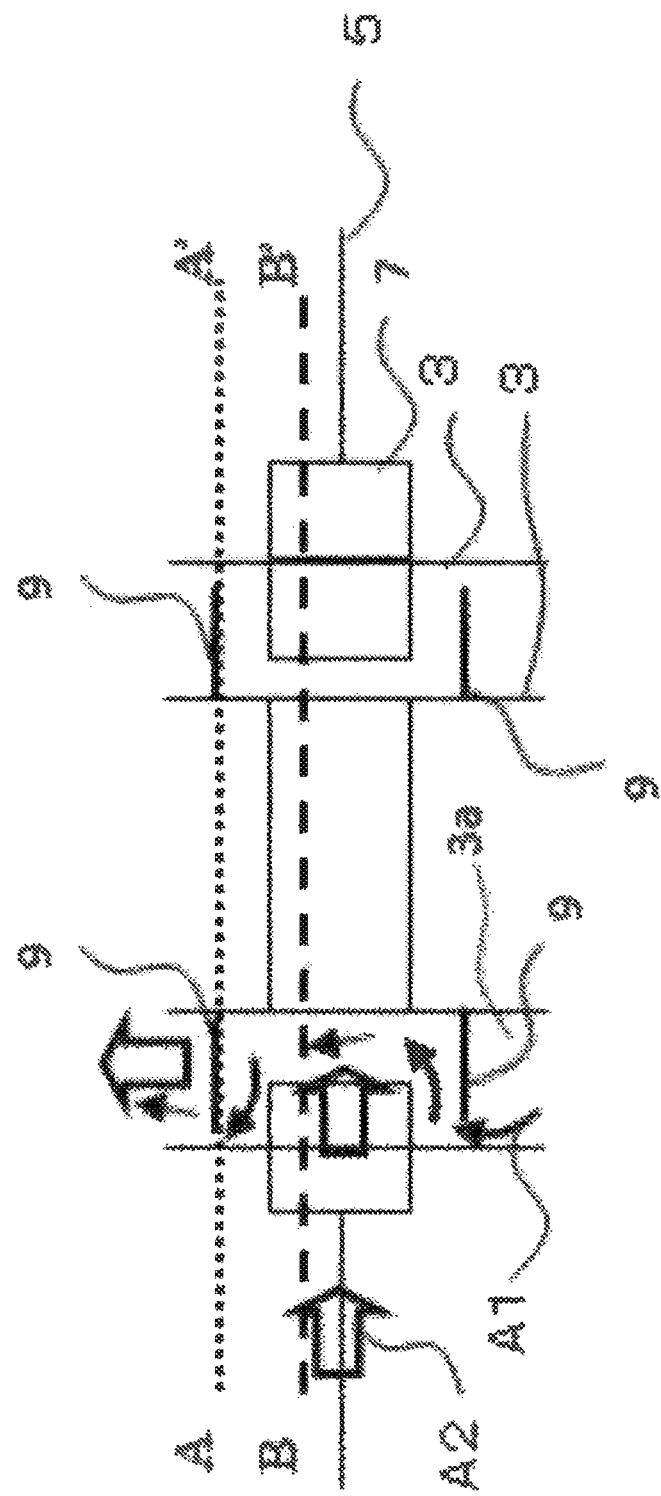
FIG. 3 is a cross-sectional view of the vicinity of heat transfer members in the superconducting magnet device according to Embodiment 1 of the present invention.
Figure 4:
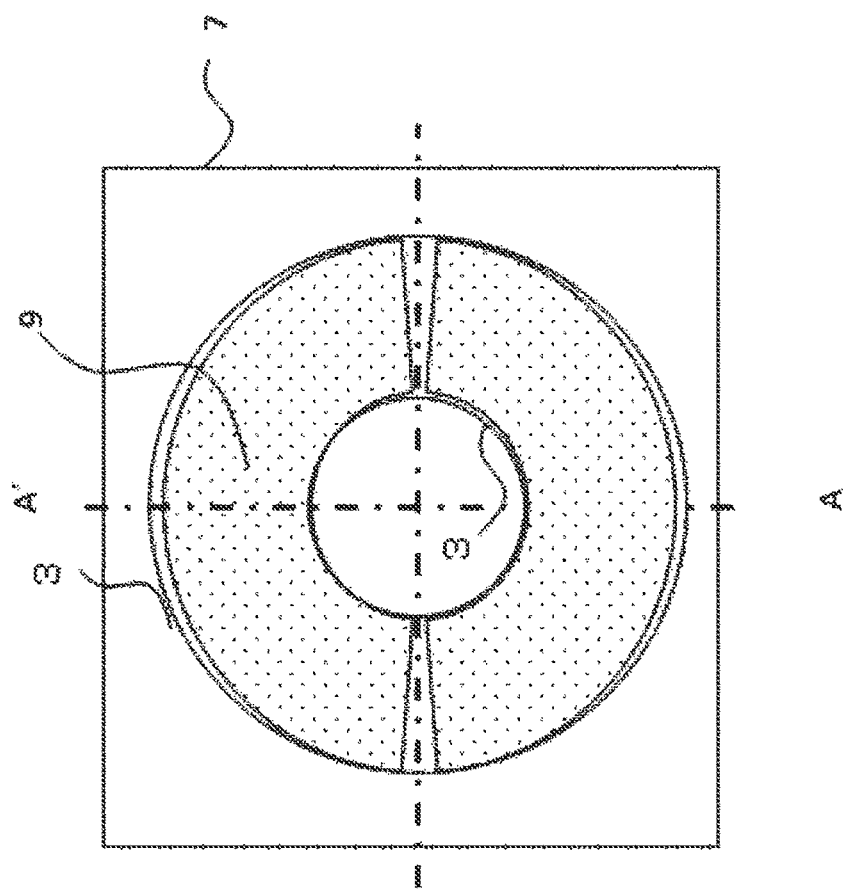
FIG. 4 is a top cross-sectional view of the superconducting magnet device taken along the A-A' line, according to Embodiment 1 of the present invention.
Figure 5:
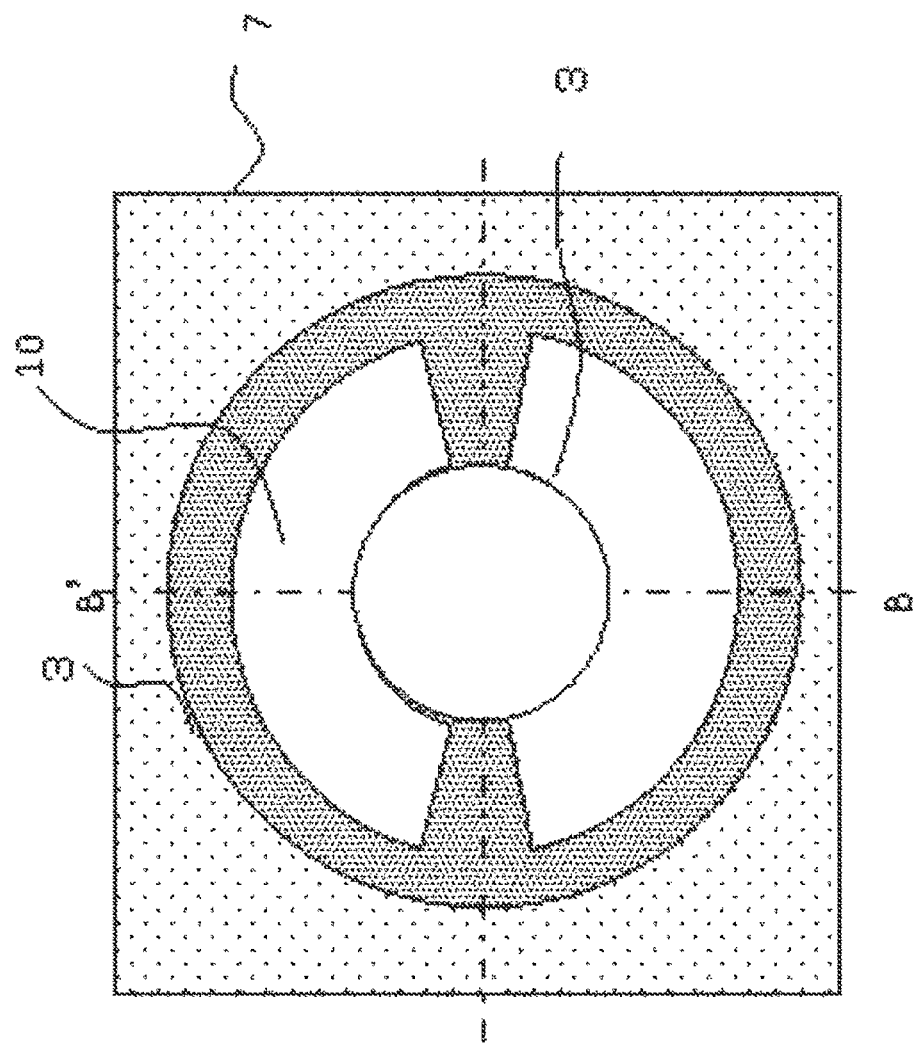
FIG. 5 is a cross-sectional view of the superconducting magnet device taken along the B-B' line, according to Embodiment 1 of the present invention.
Figure 23:
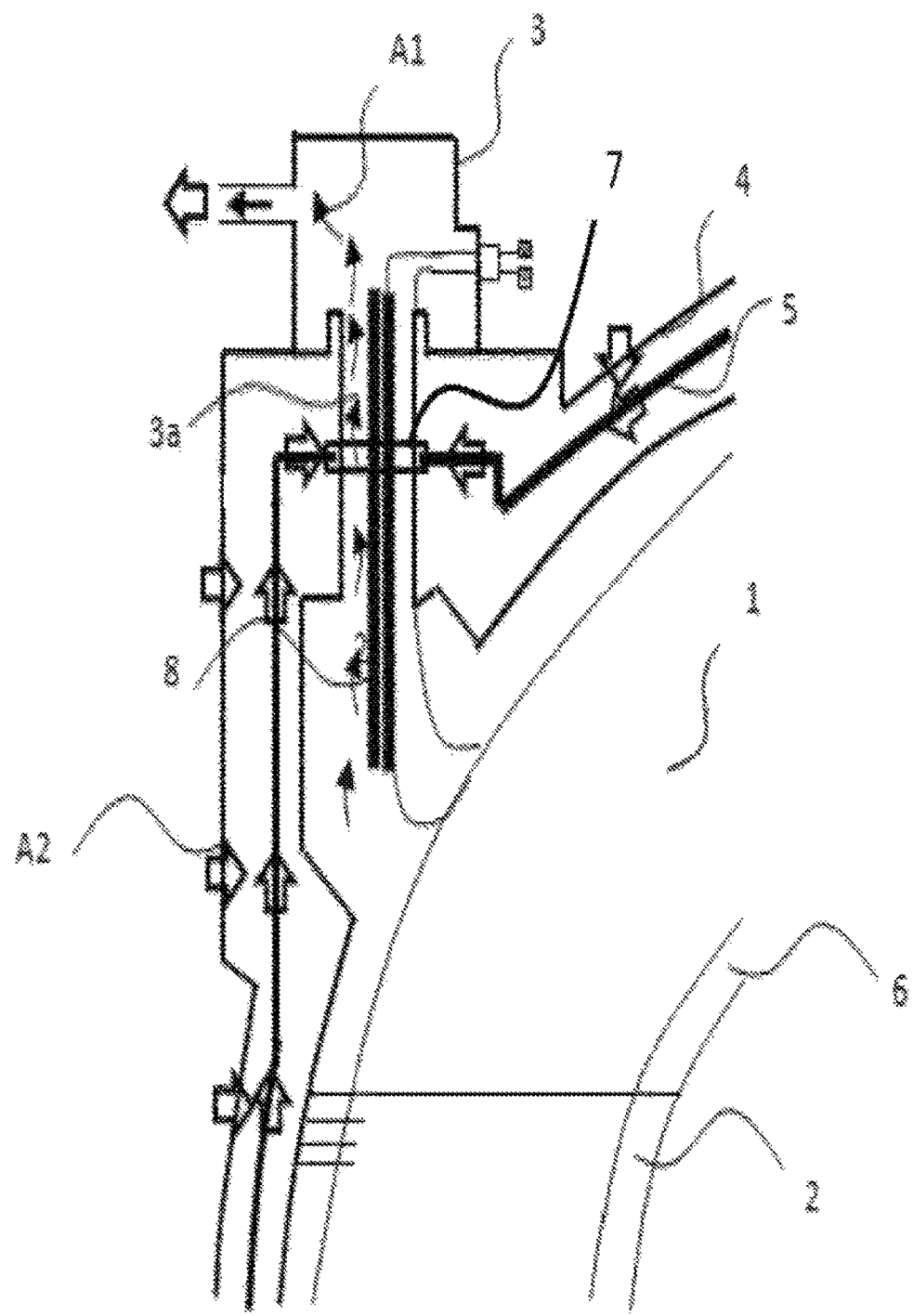
FIG. 23 is a cross-sectional view of a superconducting magnet device based on a prior art.
Figure 24:
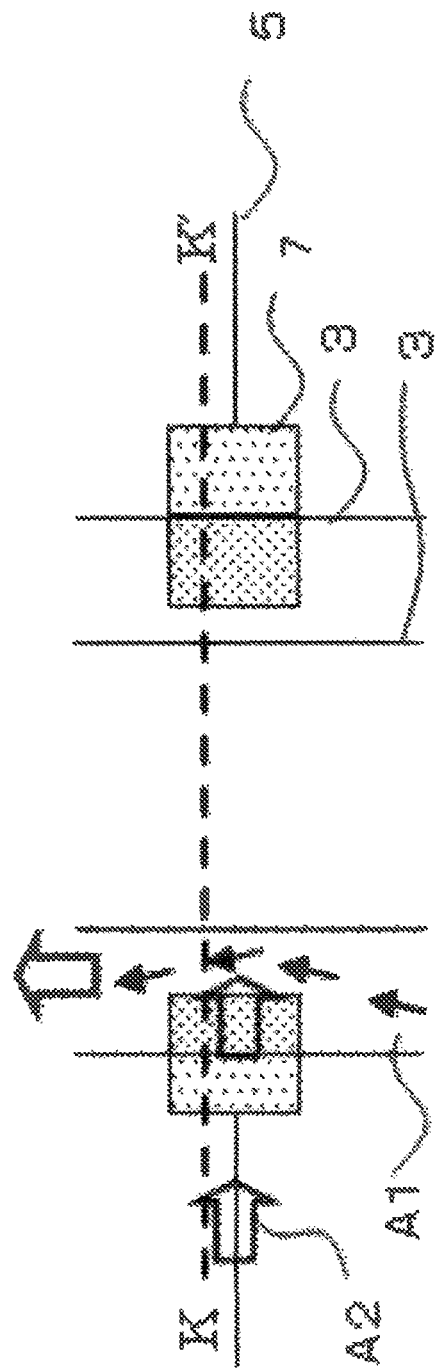
FIG. 24 is a cross-sectional view of the vicinity of heat transfer members in the superconducting magnet device based on the prior art.
Figure 25:
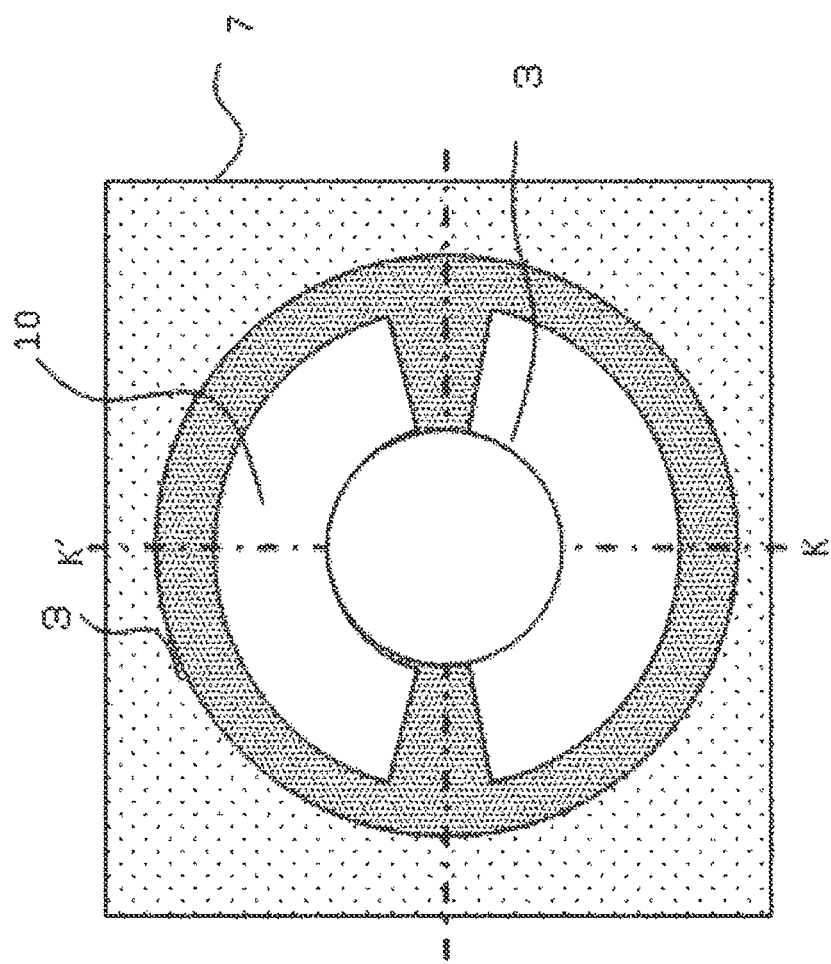
FIG. 25 is a cross-sectional view of the superconducting magnet device based on the prior art, which is taken along the K-K' line.

A superconducting magnet device according to Embodiment 1 of the present invention will be described using FIGS. 1 to 6. FIG. 1 is a schematic diagram of the superconducting magnet device. FIG. 2 and FIG. 3 are vertical cross-sectional views of the superconducting magnet device. FIG. 4 is a top cross-sectional view of the superconducting magnet device taken along the A-A' line shown in FIG. 3 when viewed from the top toward the bottom in the vertical direction. FIG. 5 is a top cross-sectional view of the superconducting magnet device taken along the B-B' line shown in FIG. 3 when viewed from the top toward the bottom in the vertical direction. FIG. 6 is a vertical cross-sectional view of the superconducting magnet device when a quench occurs. In addition to the structure of a conventional superconducting magnet device shown in FIGS. 23 to 25, these figures show a helium gas release tube 3a, a heat transfer member 7, convection-preventing members 9, and their neighboring structure, each of which is a later-described characteristic component of Embodiment 1 of the present invention.

As shown in FIG. 2, the superconducting magnet device includes a superconducting coil 1, a cryostat 3 made of stainless steel to house the superconducting coil 1 and liquid helium 2 for cooling the superconducting coil 1, a vacuum container 4 to cover a helium gas release tube 3a provided in the cryostat 3 made of stainless steel, a heat shield 5 made of aluminum having high thermal conductivity to which heat is transferred, the heat being transferred to the inside of the vacuum container 4 from the outside, a heat transfer member 7 made of copper to transfer to gaseous helium 6 inside the cryostat 3 the heat being transferred to the heat shield 5, and electrodes 8 to flow current to the superconducting coil 1 when energized. Inside the helium gas release tube 3a extending vertically, the electrodes 8, which extend vertically and are placed so as to share a common center axis with the tube, are disposed in a predetermined direction along which the gaseous helium 6 passes. In other words, the electrodes 8 are disposed near the center of the helium gas release tube 3a.

The vacuum container 4, which houses the superconducting coil 1, the liquid helium 2, and the gaseous helium 6 evaporated from the liquid helium 2, functions as a cooling container to keep the temperature of the superconducting coil 1 at 6K or lower. In shipment, the superconducting coil 1 inside the vacuum container 4 is immersed in the liquid helium 2.

The heat shield 5 is embedded in the vacuum container 4 to entirely cover the vacuum container 4 which stores the liquid helium 2. The heat shield 5 made of aluminum absorbs radiant heat depending on the heat transferred to the vacuum container 4 from the outside to conduct the absorbed heat to the heat transfer member 7.

The gaseous helium 6 flows through the internal space of the helium gas release tube 3a in a predetermined passing direction. The heat transfer member 7 is disposed along a direction crossing the passing direction of the gaseous helium 6, and a part of the heat transfer member 7 protrudes into the internal space of the helium gas release tube 3a. The heat transfer member 7, being a metal plate made of a material with high thermal conductivity such as copper, is disposed so as to horizontally intersect with the helium gas release tube 3a that vertically extends. Also, the heat shield 5 and the heat transfer member 7 are joined. Therefore, when the gaseous helium 6 comes into contact with the protruding part of the heat transfer member 7, the heat from the outside that is absorbed by the heat shield 5 and conducted to the heat transfer member 7 is exchanged into the gaseous helium 6, and then the gaseous helium 6 after the heat exchange is released to the outside. In other words, the heat shield 5 is cooled by the heat transfer member 7.

The superconducting magnet device is installed in an indoor environment. In order to keep a superconducting state of the superconducting coil 1, the heat transferred from the outside of the vacuum container 4 needs to be discharged efficiently. Thus, in the superconducting magnet device with such a configuration described above, the heat from the outside is absorbed by the heat shield 5 made of aluminum, the heat absorbed by the heat shield 5 is conducted to the heat transfer member 7, the gaseous helium 6 that is evaporated comes into contact with the heat transfer member 7 with the heat conducted, and the gaseous helium 6 that received the heat through the contact is guided and released through the helium gas release tube 3a to the outside. In other words, the superconducting magnet device has a function as a chiller using the gaseous helium 6 as a coolant, and thus heat transfer from the outside to the liquid helium 2 contained inside is suppressed, so that the cooling state of the superconducting coil 1 inside the vacuum container 4 can be maintained. Arrows shown in FIG. 3 denote the heat path resulting from the configuration described above.

In order to adjust internal pressure of the superconducting magnet device, a pressure valve as a vent for the gaseous helium 6 evaporated from the liquid helium 2 and passing through the helium gas release tube 3a, is provided in the cryostat 3, and thus the release amount of the gaseous helium 6 to the outside of the superconducting magnet device can be controlled.

When the helium gas release tube 3a is viewed from the axis direction, namely from the vertical direction, as shown in FIG. 5, the heat transfer member 7 protrudes toward the inside of the helium gas release tube 3a, and a part of the heat transfer member 7 reaches an inner wall that is close to the electrodes 8 and in the helium gas release tube 3a. FIG. 5 shows an example of helium passage 10, which is fan-shaped and penetrated, and however, the shape thereof may be changed to any shape. The helium gas release tube 3a may be supported by the part of the heat transfer member 7 reaching the inner wall close to the electrodes 8.

The convection-preventing members 9 are disposed on the upper side (in the downstream of gas release) and the lower side (in the upstream of gas release) of the protruding part of the heat transfer member 7 inside the helium gas release tube 3a. The convection-preventing members 9 each are a sheet made of resin with a thickness about 1 mm, and the resin is a material used in the superconductor application products, etc., for a cryogenic application. In the example shown in FIG. 3, the convection-preventing members 9 are disposed at about 30 mm above and at about 30 mm below the heat transfer member 7, both being fixed to an inner peripheral wall of the helium gas release tube 3a. The convection-preventing members 9 are elastic and deformable by the wind pressure of the gaseous helium 6. The convection-preventing members 9 may be disposed at either one side, instead of both upper and lower sides of the heat transfer member 7 in the vertical direction as in the example of Embodiment 1.

As shown in FIG. 4, the convection-preventing members 9 are disposed so as to overhang all of the heat transfer member 7 inside the helium gas release tube 3a. As shown in FIG. 5, the helium passage 10 of the heat transfer member 7 is of the same structure as the conventional helium passage 10 shown in FIG. 25.

The convection-preventing members 9 are fixed to the inner peripheral wall of the helium gas release tube 3a, and there may be slight gaps between the convection-preventing members 9 and the outer peripheral wall of the helium gas release tube 3a that exists in the opposite side of the inner peripheral wall. Normally, in the area where the convection-preventing members 9 are provided, the helium gas that is slightly evaporated passes near the outer peripheral wall (FIG. 3). Since the heat transfer member 7 protrudes from the outer peripheral wall and the convection-preventing members 9 overhang the helium passage 10, compared with the case in which the convection-preventing members 9 do not overhang the helium passage, the amount of the gaseous helium 6 that collides and makes contact with the heat transfer member 7 increases and the flow of the gaseous helium 6 concentrates around the protruding part of the heat transfer member 7. Because the upper and lower convection-preventing members 9 are provided, the gaseous helium 6 avoiding the lower convection-preventing member 9 flows upward to collide and make contact with the bottom surface of the heat transfer member 7, and after colliding and making contact with the bottom surface, the gaseous helium 6 flows toward the helium passage 10 near the side wall of the heat transfer member 7 facing the side of the electrode 2, and after passing through the helium passage 10, the gaseous helium 6 avoiding the upper convection-preventing member 9 and making contact with the upper surface of the heat transfer member 7 is released to the outside. That is, because flow of the gaseous helium 6 passing straight and vertically from downward to upward is restrained, the release amount of the gaseous helium can be reduced. In addition, the increased chance for the gaseous helium 6 to make contact with the heat transfer member 7 improves heat exchange efficiency. Even in the case where the convection-preventing member 9 is provided in one side, either above or below the heat transfer member 7, because the flow of the gaseous helium 6 passing straight and vertically from downward to upward is restrained, the release amount of the gaseous helium can be reduced. In the case where the convection-preventing members 9 are disposed above the heat transfer member 7, the chance for the gaseous helium 6 to make contact with the top surface of the heat transfer member 7 can be increased. Also, in the case where the convection-preventing members 9 are disposed below the heat transfer member 7, the chance for the gaseous helium 6 to collide and make contact with the bottom surface of the heat transfer member 7 can be increased. Thus, the convection-preventing members 9 disposed even in one side, either above or below the heat transfer member 7, can improve heat exchange efficiency.

In the superconducting magnet device with such a configuration, by disposing the convection-preventing members 9 above and below the heat transfer member 7, the gaseous helium 6 can be concentrated toward the heat transfer member 7 that transfers to the gaseous helium 6 the heat transferred from the outside, and in addition, the length of a flow path where the gaseous helium 6 makes contact with the surface of the heat transfer member 7 can be extended and a thickness of the temperature boundary layer can be reduced, so that the heat exchange amount can be increased. Thus, the temperature in the vacuum container 4 through the heat shield 5 provided can be maintained to be lower than the temperature of a conventional vacuum container 4, so that consumption of the liquid helium 2 can be reduced.

The gaseous helium 6 which avoids the heat transfer member 7 and passes through the helium gas release tube 3a is released to the outside of the cryostat 3, namely the outside of the superconducting magnet device, through the pressure valve. Because the gaseous helium 6 is released by natural convection, it flows calmly at the speed less than 1 m/s.

Since the helium passage 10 in the helium gas release tube 3a is made narrow by the convection-preventing members 9, in the case where the quench occurs owing to some cause and then a large amount of liquid helium 2 is evaporated, increase of the internal pressure of the superconducting magnet device may cause breakage of the device. However, because the convection-preventing members 9 are fixed in the inner peripheral wall of the helium gas release tube 3a near the electrodes 8, the increased internal pressure lifts the convection-preventing members 9 vertically upward as shown in FIG. 6, so that a comparable flow path width to the conventional device can be obtained. Therefore, even in the case where the quench occurs, pressure increase in the helium gas release tube 3a can be suppressed, so that the breakage of the superconducting magnet device can be avoided.

Although the distance between the heat transfer member 7 and the convection-preventing members 9 is not particularly restricted, it needs to be the extent that the lifting of the convection-preventing members 9 must not be hindered when the quench occurs. Further, a proper distance may be set in consideration of the deformation of the convection-preventing members 9.

Embodiment 2

Figure 7:
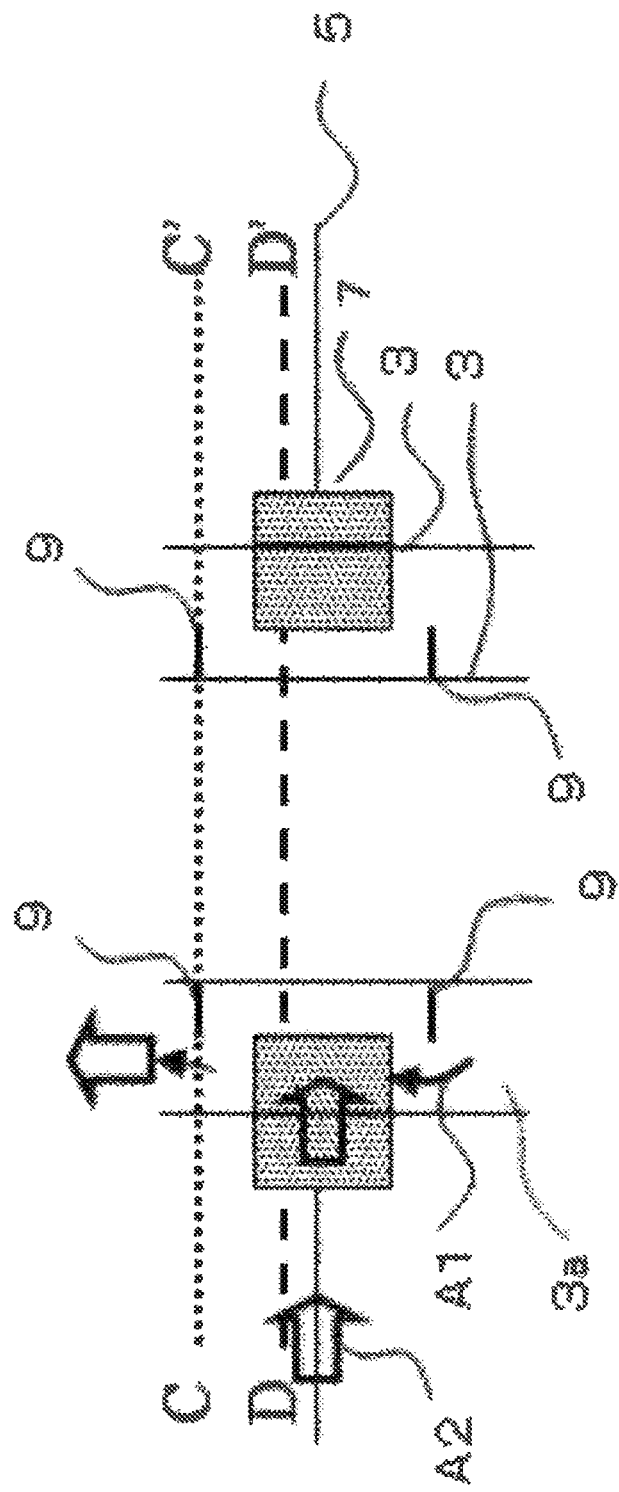
FIG. 7 is a cross-sectional view of a superconducting magnet device according to Embodiment 2 of the present invention.
Figure 8:
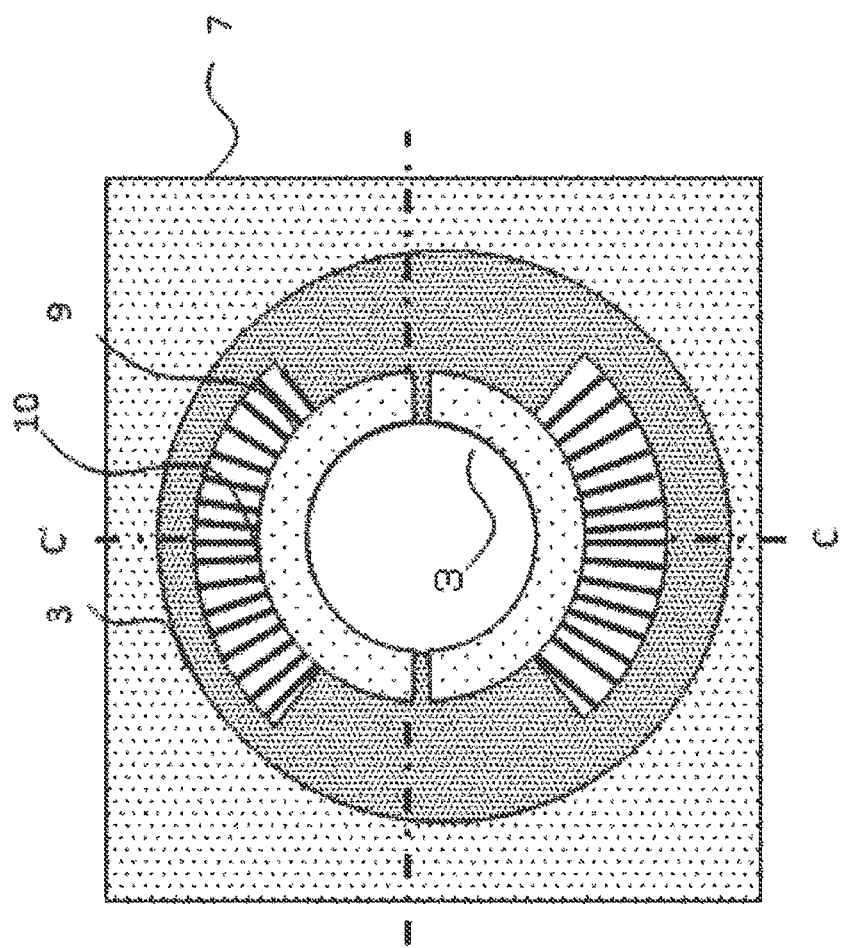
FIG. 8 is a top cross-sectional view of the superconducting magnet device taken along the C-C' line, according to Embodiment 2 of the present invention.
Figure 9:
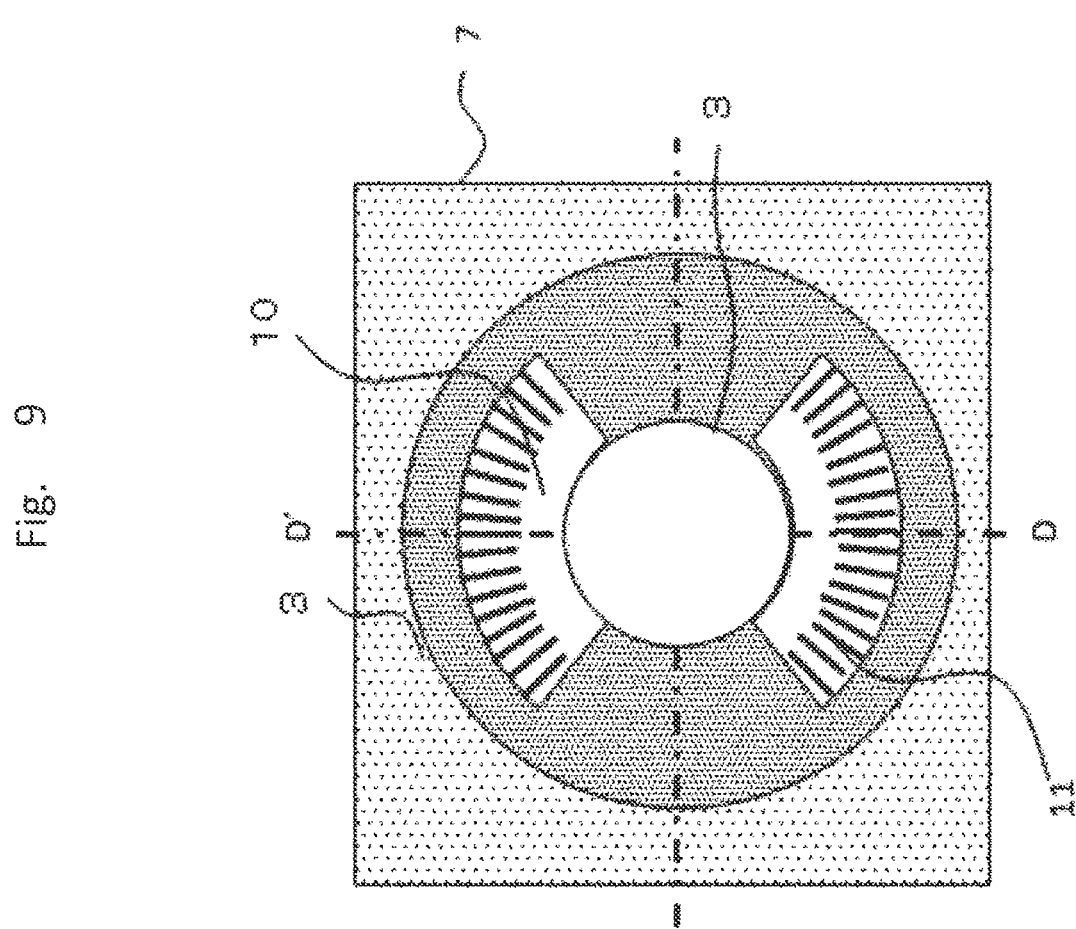
FIG. 9 is a cross-sectional view of the superconducting magnet device taken along the D-D' line, according to Embodiment 2 of the present invention.

A superconducting magnet device according to Embodiment 2 of the present invention will be described using FIGS. 7 to 10. FIG. 7 is a vertical cross-sectional view, FIG. 8 is a top cross-sectional view taken along the C-C' line in FIG. 7, FIG. 9 is a top cross-sectional view taken along the D-D' line in FIG. 7, and FIG. 10 is a vertical cross-sectional view when a quench occurs. In addition to the structure of a conventional superconducting magnet device shown in FIGS. 23, 24, and 25, these figures show a helium gas release tube 3a, a heat transfer member 7, convection-preventing members 9, and their neighboring structure, each of which is a later-described characteristic component of Embodiment 2 of the present invention. The description on the same configuration as that in Embodiment 1 will be omitted.

As major components, the superconducting magnet device includes a superconducting coil 1, liquid helium 2, a helium gas release tube 3a, a vacuum container 4, a heat shield 5, a heat transfer member 7, electrodes 8, and convection-preventing members 9.

The vacuum container 4 is a cooling container to keep the temperature of the superconducting coil 1 at 6K or lower. In shipment, the superconducting coil 1 inside the vacuum container 4 is immersed in the liquid helium 2.

The convection-preventing members 9 each are a sheet made of resin with a thickness about 1 mm, and the resin is a material used in the superconductor application products, etc., not only for a cryogenic application but also for a special application such as an artificial satellite. As shown in FIG. 7, the convection-preventing members 9 are disposed at about 30 mm above and at about 30 mm below the heat transfer member 7, both being fixed to the inner peripheral wall of the helium gas release tube 3a.

As shown in FIG. 8, the convection-preventing members 9 are disposed so as to overhang the inner peripheral side of the heat transfer member 7 in the helium gas release tube 3a. In other words, the convection-preventing members 9 are disposed so as to be able to at least partly overhang inside the helium gas release tube 3a, positioned between the electrodes 8 and the heat transfer member 7. The heat transfer member 7 is a heat sink and the surface thereof is comb-shaped as shown in FIG. 9, thereby having a significantly increased heat dissipation area than in a conventional device. The heat sink has fins, and the fins formed through cutting and raising each are bonded by soldering, or the fins are formed through copper machining.

In the superconducting magnet device with the configuration described above, as shown in FIG. 7, because the convection-preventing members 9 are disposed above and below the heat transfer member 7 that transfers to the gaseous helium 6 the heat transferred from the outside, the gaseous helium 6 can be concentrated around heat sink areas 11 of the heat transfer member 7, and thus the heat exchange amount can be increased. Therefore, the superconducting magnet device according to Embodiment 2 can keep the temperature of the superconducting coil 1 lower than that in a conventional superconducting magnet device, so that consumption of the liquid helium 2 can be reduced.

The gaseous helium 6, avoiding the heat transfer member and passing through the helium gas release tube 3a, is released to the outside of the cryostat 3, namely the outside of the superconducting magnet device, through the pressure valve. Also, the gaseous helium 6 is released by natural convection energized from liquid evaporation, thereby flowing calmly at the speed less than 1 m/s.

Since the helium passage 10 in the helium gas release tube 3a is made narrow by the convection-preventing members 9, in the case where the quench occurs owing to some cause and then a large amount of liquid helium 2 is evaporated, increase of the internal pressure of the superconducting magnet device may cause breakage of the device. However, because the convection-preventing members 9 are fixed in the inner peripheral wall of the helium gas release tube 3a near the electrodes 8, the increased internal pressure lifts the convection-preventing members 9 vertically upward as shown in FIG. 10, so that a comparable flow path width to the conventional device can be obtained. Therefore, even in the case where the quench occurs, pressure increase in the helium gas release tube 3a can be suppressed, so that the breakage of the superconducting magnet device can be avoided.

Embodiment 3

Figure 11:
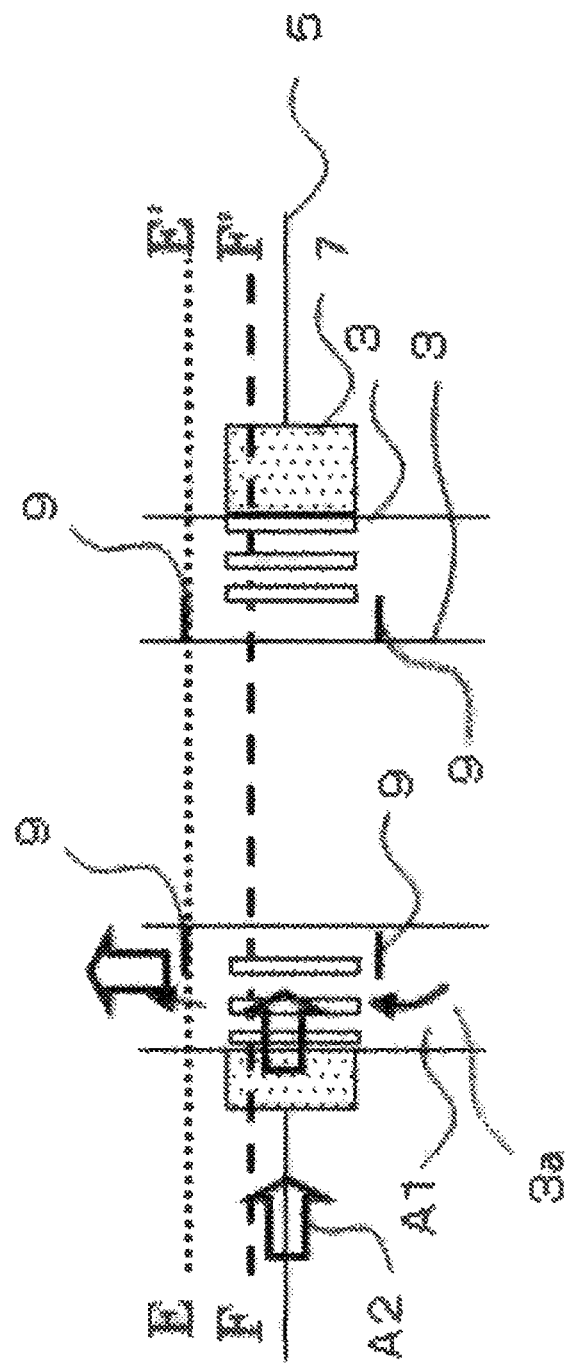
FIG. 11 is a cross-sectional view of a superconducting magnet device according to Embodiment 3 of the present invention.
Figure 12:
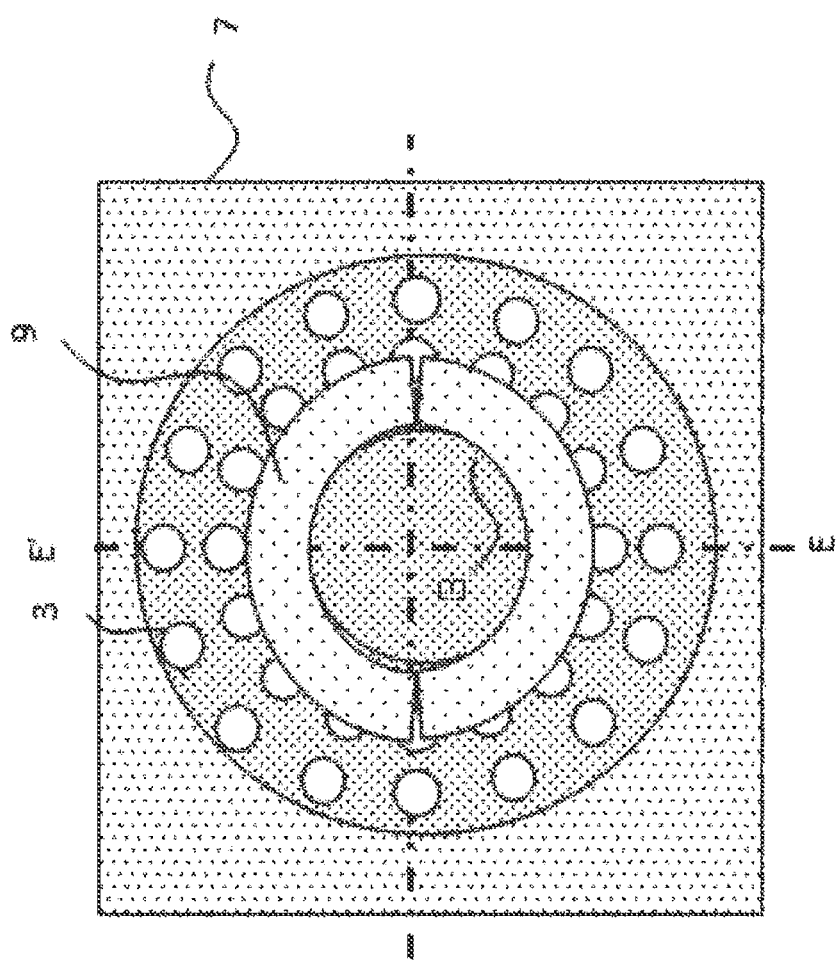
FIG. 12 is a top cross-sectional view of the superconducting magnet device taken along the E-E' line, according to Embodiment 3 of the present invention.
Figure 13:
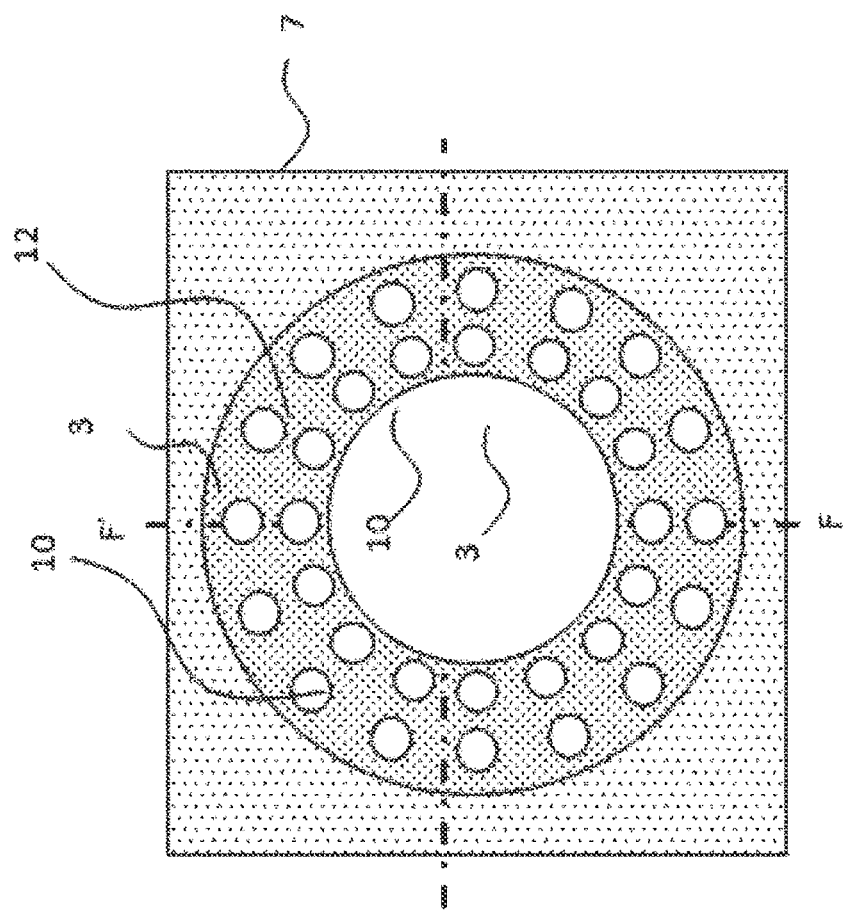
FIG. 13 is a cross-sectional view of the superconducting magnet device taken along the F-F' line, according to Embodiment 3 of the present invention.
Figure 14:
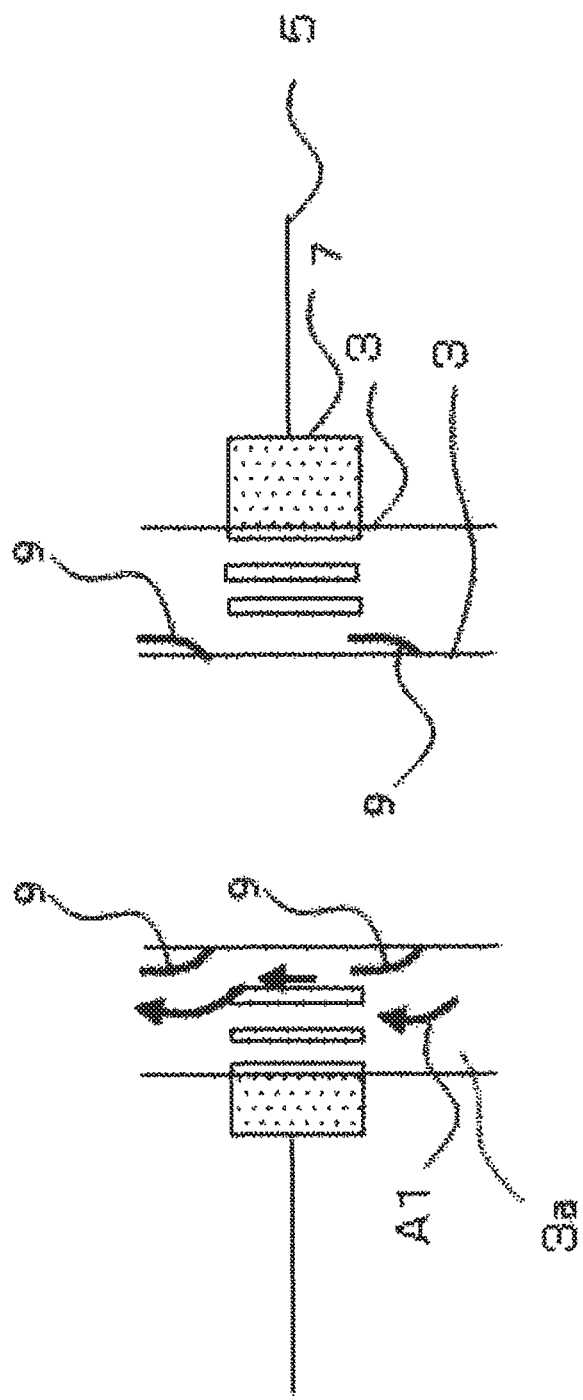
FIG. 14 is a cross-sectional view of the superconducting magnet device according to Embodiment 3 of the present invention when the quench occurs.

Embodiment 3 of the present invention will be described using FIGS. 11 to 14. FIG. 11 is a vertical cross-sectional view, FIG. 12 is a top cross-sectional view taken along the E-E' line in FIG. 11, FIG. 13 is a cross-sectional view taken along the F-F' line in FIG. 11, and FIG. 14 is a vertical cross-sectional view when a quench occurs. In addition to the structure of a conventional superconducting magnet shown in FIGS. 23, 24, and 25, these figures show a helium gas release tube 3a, a heat transfer member 7, convection-preventing members 9, and their neighboring structure, each of which is a later-described characteristic component of Embodiment 3 of the present invention.

In addition to conventional components such as a superconducting coil 1, liquid helium 2, a helium gas release tube 3a, a vacuum container 4, a heat shield 5, a heat transfer member 7, and electrodes 8, the superconducting magnet device includes convection-preventing members 9 as a major component.

The vacuum container 4 is a cooling container to keep the temperature of the superconducting coil 1 at 6K or lower. In shipment, the superconducting coil 1 inside the vacuum container 4 is immersed in the liquid helium 2.

The convection-preventing members 9 each are a sheet made of resin with a thickness about 1 mm, and the resin is a material used in the superconductor application products, etc., not only for a cryogenic application but also for a special application such as an artificial satellite. As shown in FIG. 11, the convection-preventing members 9 are disposed at about 30 mm above and at about 30 mm below the heat transfer member 7, both being fixed to the inner peripheral wall of the helium gas release tube 3a.

As shown in FIG. 12, the convection-preventing members 9 are disposed so as to overhang the inner peripheral side of the heat transfer member 7 in the helium gas release tube 3a. As shown in FIG. 13, the heat transfer member 7 has a structure with a plurality of openings from its surface, thereby significantly increasing the heat dissipation area compared with a heat transfer member 7 without openings. These openings are formed by copper machining.

In the superconducting magnet device with the configuration described above, as shown in FIG. 11, because the convection-preventing members 9 are disposed above and below the heat transfer member 7 that transfers to the gaseous helium 6 the heat transferred from the outside, the gaseous helium 6 can be concentrated around heat exchange areas 12 of the heat transfer member 7, and thus the heat exchange amount can be increased. Therefore, the superconducting magnet, device according to Embodiment 3 can keep the temperature of the superconducting coil 1 lower than that in a conventional superconducting magnet device, so that consumption of the liquid helium 2 can be reduced.

The gaseous helium 6, avoiding the heat transfer member 7 and passing through the helium gas release tube 3a, is released to the outside of the cryostat 3, namely the outside of the superconducting magnet device, through the pressure valve. Also, the gaseous helium 6 is released by natural convection energized from liquid evaporation, thereby flowing calmly at the speed less than 1 m/s.

Since the helium passage 10 in the helium gas release tube 3a is made narrow by the convection-preventing members 9, in the case where the quench occurs owing to some cause and then a large amount of liquid helium 2 is evaporated, increase of the internal pressure of the superconducting magnet device may cause breakage of the device. However, because the convection-preventing members 9 are fixed in the inner peripheral wall of the helium gas release tube 3a near the electrodes 8, the increased internal pressure lifts the convection-preventing members 9 vertically upward as shown in FIG. 14, so that a comparable flow path width to the conventional device can be obtained. Therefore, even in the case where the quench occurs, pressure increase in the helium gas release tube 3a can be suppressed, so that the breakage of the superconducting magnet device can be avoided.

Embodiment 4

Figure 15:
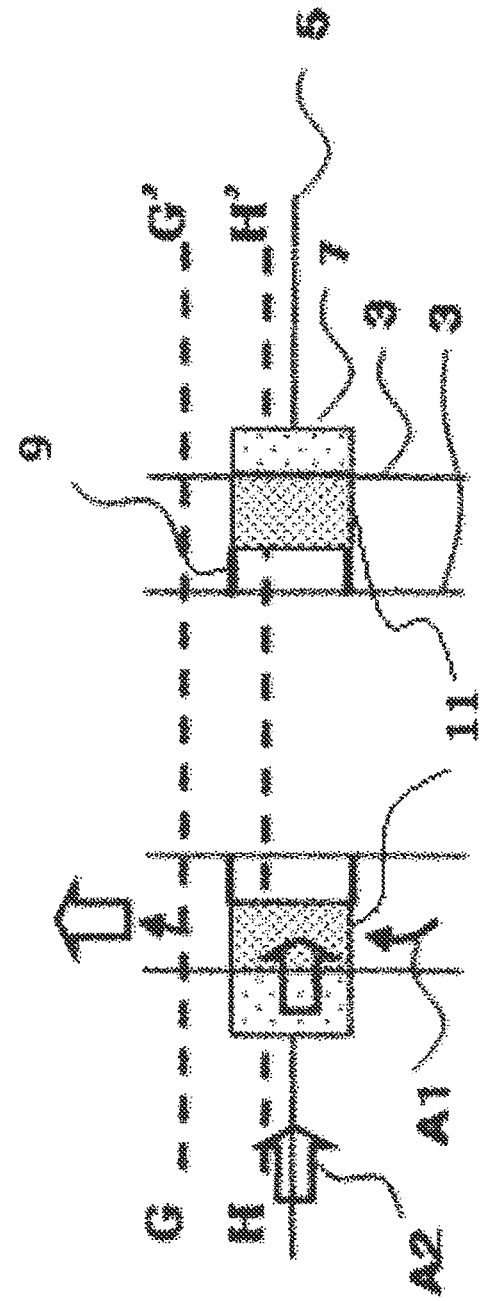
FIG. 15 is a cross-sectional view of a superconducting magnet device according to Embodiment 4 of the present invention.
Figure 16:
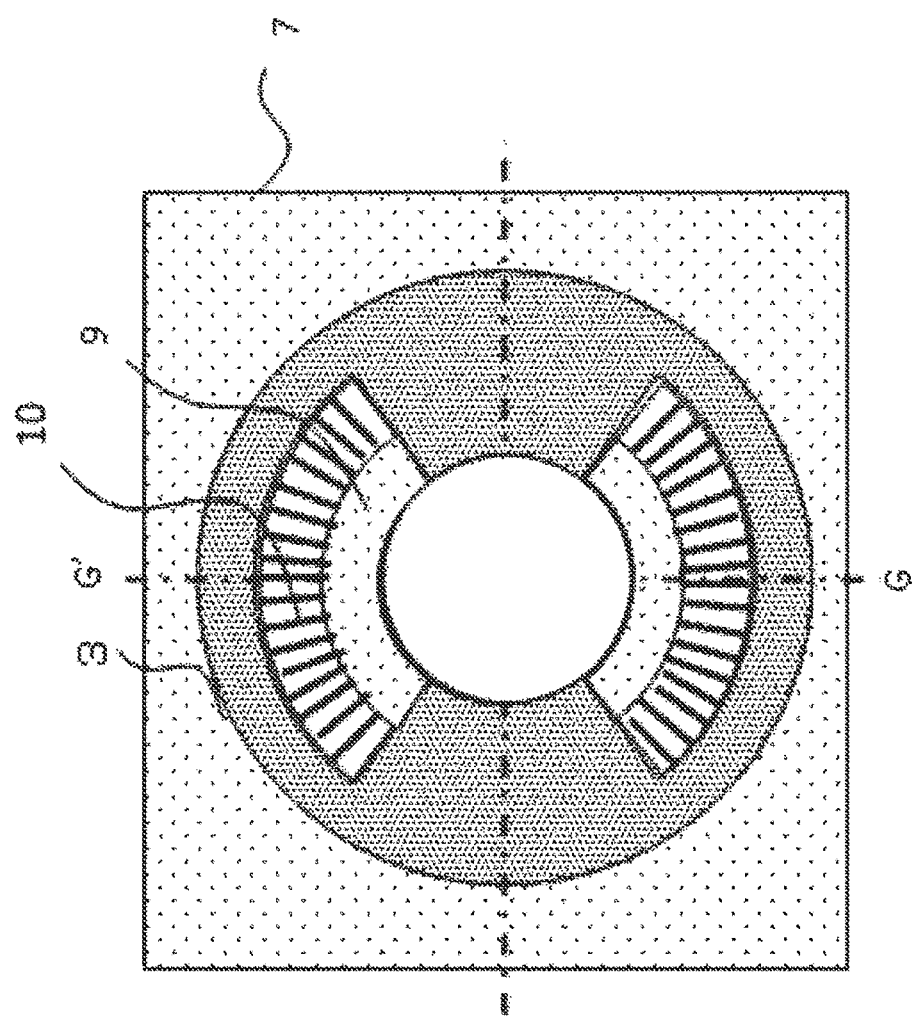
FIG. 16 is a top cross-sectional view of the superconducting magnet device taken along the G-G' line, according to Embodiment 4 of the present invention.
Figure 17:
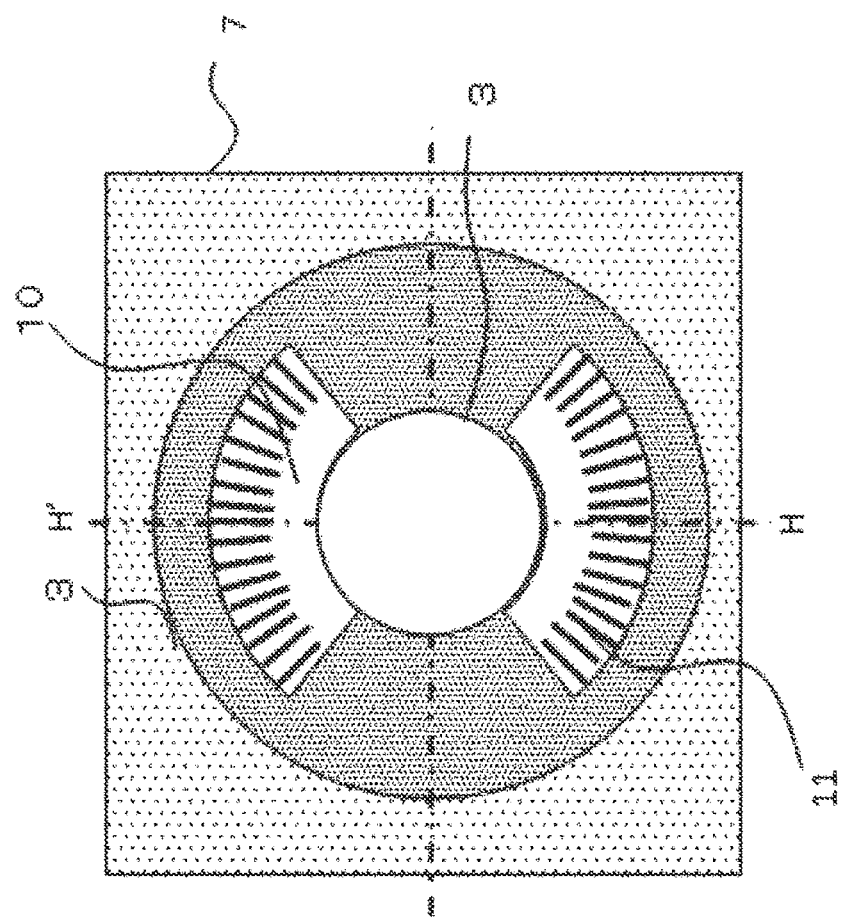
FIG. 17 is a cross-sectional view of the superconducting magnet device taken along the H-H' line, according to Embodiment 4 of the present invention.
Figure 18:
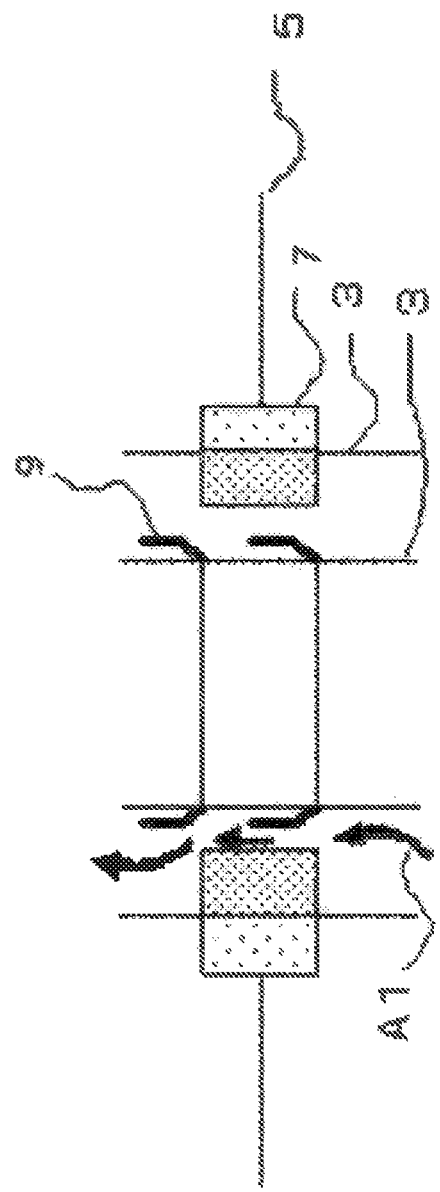
FIG. 18 is a cross-sectional view of the superconducting magnet device according to Embodiment 4 of the present invention when the quench occurs.

A superconducting magnet device according to Embodiment 4 of the present invention will be described using FIGS. 15 to 18. FIG. 15 is a vertical cross-sectional view, FIG. 16 is a top cross-sectional view taken along the G-G' line in FIG. 15, FIG. 17 is a cross-sectional view taken along the H-H' line in FIG. 15, and FIG. 18 is a vertical cross-sectional view when a quench occurs. In addition to the structure of a conventional superconducting magnet shown in FIGS. 23 to 25, these figures show a helium gas release tube 3a, a heat transfer member 7, convection-preventing members 9, and their neighboring structure, each of which is a later-described characteristic component of Embodiment 4 of the present invention. The description on the same configuration as that in Embodiment 1 will be omitted.

As major components, the superconducting magnet device according to Embodiment 4 includes a superconducting coil 1, liquid helium 2, a helium gas release tube 3a, a vacuum container 4, a heat shield 5, a heat transfer member 7, electrodes 8, and convection-preventing members 9.

The vacuum container 4 is a cooling container to keep the temperature of the superconducting coil 1 at 6K or lower. In shipment, the superconducting coil 1 inside the vacuum container 4 is immersed in the liquid helium 2.

The convection-preventing members 9 each are a sheet made of resin with a thickness about 1 mm, and the resin is a material used in the superconductor application products, etc., not only for a cryogenic application but also for a special application such as an artificial satellite. As shown in FIG. 15, the convection-preventing members 9 are disposed at the upper end position and at the lower end position of the heat transfer member 7, both being fixed to the inner peripheral wall of the helium gas release tube 3a.

As shown in FIG. 16, the convection-preventing members 9 are disposed so as to overhang the inner peripheral side of the heat transfer member 7 in the helium gas release tube 3a. In other words, the convection-preventing members 9 are disposed so as to be able to at least partly overhang inside the helium gas release tube 3a, positioned between the electrodes 8 and the heat transfer member 7. The heat transfer member 7 is a heat sink and the surface thereof is comb-shaped as shown in FIG. 17, thereby having a significantly increased heat dissipation area than in a conventional device. The heat sink has fins, and the fins formed through cutting and raising each are bonded by soldering, or the fins are formed through copper machining.

In the superconducting magnet device with the configuration described above, as shown in FIG. 15, because the convection-preventing members 9 are disposed above and below the heat transfer member 7 that transfers to the gaseous helium 6 the heat transferred from the outside, the gaseous helium 6 can be concentrated around heat sink areas 11 of the heat transfer member 7, and thus the heat exchange amount can be increased. Therefore, the superconducting magnet device according to Embodiment 4 can keep the temperature of the superconducting coil 1 lower than that in a conventional superconducting magnet device, so that consumption of the liquid helium 2 can be reduced.

The gaseous helium 6, avoiding the heat transfer member and passing through the helium gas release tube 3a, is released to the outside of the cryostat 3, namely the outside of the superconducting magnet device, through the pressure valve. Also, the gaseous helium 6 is released by natural convection energized from liquid evaporation, thereby flowing calmly at the speed less than 1 m/s.

Since the helium passage 10 in the helium gas release tube 3a is made narrow by the convection-preventing members 9, in the case where the quench occurs owing to some cause and then a large amount of liquid helium 2 is evaporated, increase of the internal pressure of the superconducting magnet device may cause breakage of the device. However, because the convection-preventing members 9 are fixed in the inner peripheral wall of the helium gas release tube 3a near the electrodes 8, the increased internal pressure lifts the convection-preventing members 9 vertically upward as shown in FIG. 18, so that a comparable flow path width to the conventional device can be obtained. Therefore, even in the case where the quench occurs, pressure increase in the helium gas release tube 3a can be suppressed, so that the breakage of the superconducting magnet device can be avoided.

Embodiment 5

Figure 19:
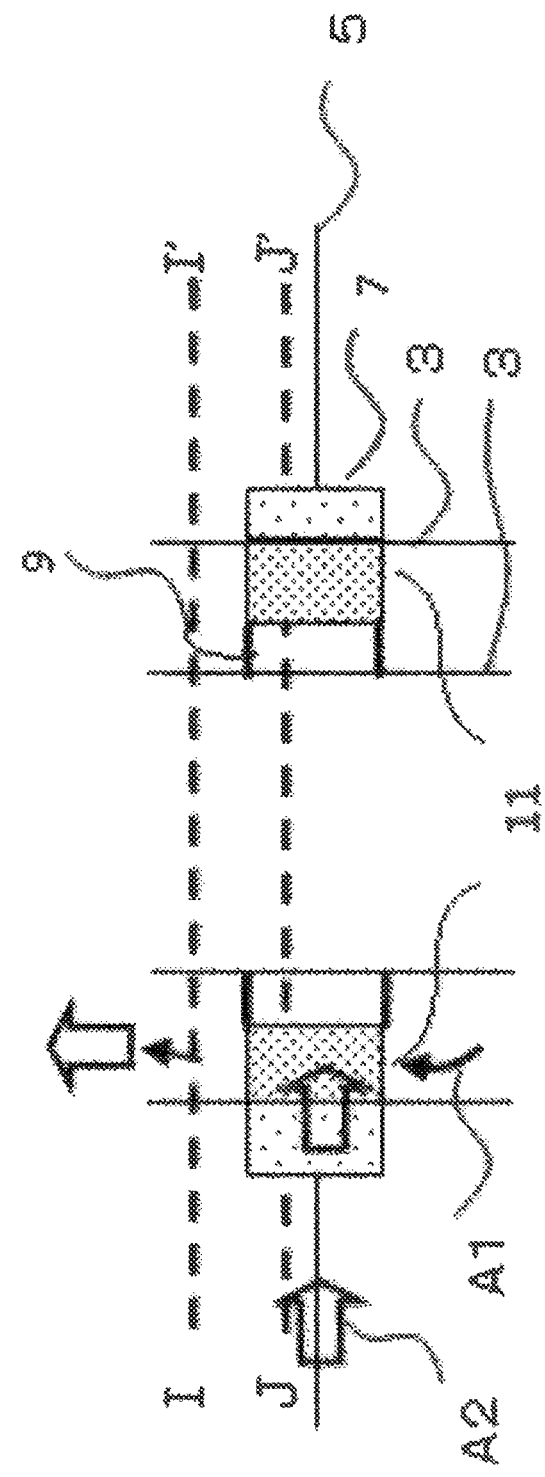
FIG. 19 is a cross-sectional view of a superconducting magnet device according to Embodiment 5 of the present invention.
Figure 20:
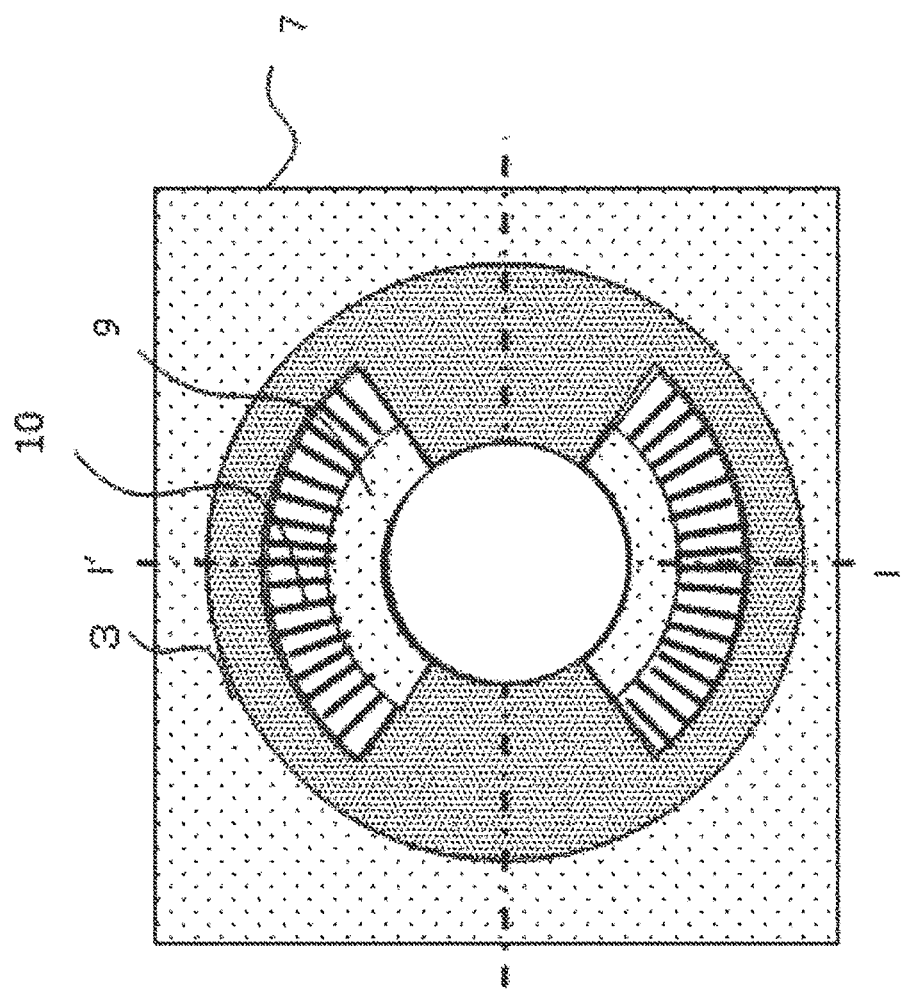
FIG. 20 is a top cross-sectional view of the superconducting magnet device taken along the I-I' line, according to Embodiment 5 of the present invention.
Figure 21:
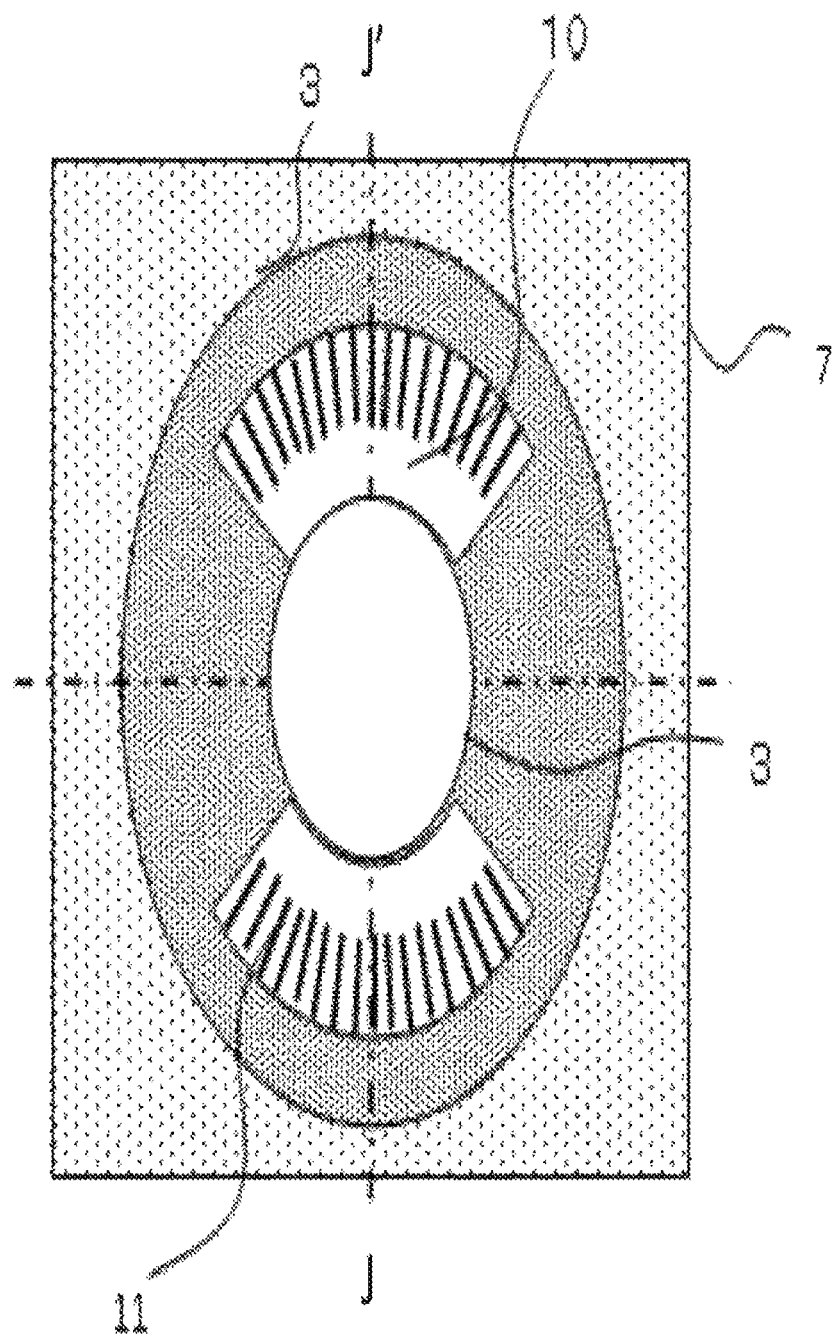
FIG. 21 is a cross-sectional view of the superconducting magnet device taken along the J-J' line, according to Embodiment 5 of the present invention.
Figure 22:
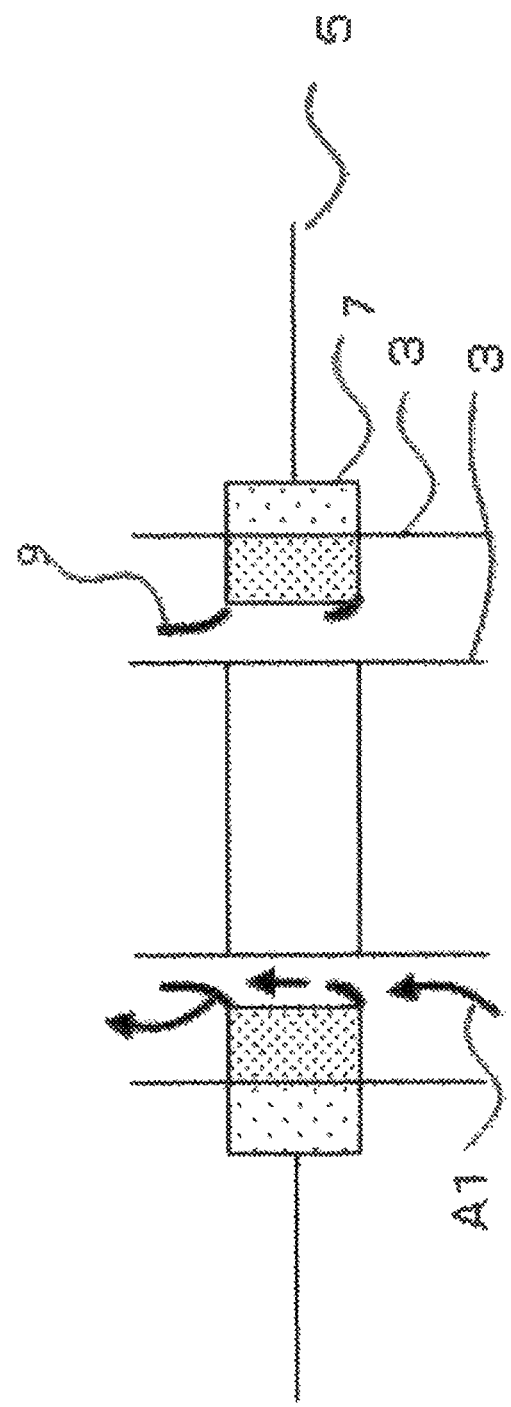
FIG. 22 is a cross-sectional view of the superconducting magnet device according to Embodiment 5 of the present invention when the quench occurs.

A superconducting magnet device according to Embodiment 5 of the present invention will be described using FIGS. 19 to 22. FIG. 19 is a vertical cross-sectional view, FIG. 20 is a top cross-sectional view taken along the I-I' line in FIG. 19, FIG. 21 is a cross-sectional view taken along the J-J' line in FIG. 19, and FIG. 22 is a vertical cross-sectional view when a quench occurs. In addition to the structure of a conventional superconducting magnet shown in FIGS. 23, 24, and 25, these figures show a helium gas release tube 3a, a heat transfer member 7, convection-preventing members 9, and their neighboring structure, each of which is a later-described characteristic component of Embodiment 5 of the present invention. The description on the same configuration as that in Embodiment 1 will be omitted.

As major components, the superconducting magnet device according to Embodiment 5 includes a superconducting coil 1, liquid helium 2, a helium gas release tube 3a, a vacuum container 4, a heat shield 5, a heat transfer member 7, electrodes 8, and convection-preventing members 9.

The vacuum container 4 is a cooling container to keep the temperature of the superconducting coil 1 at 6K or lower. In shipment, the superconducting coil 1 inside the vacuum container 4 is immersed in the liquid helium 2.

The convection-preventing members 9 each are a sheet made of resin with a thickness about 1 mm, and the resin is a material used in the superconductor application products, etc., not only for a cryogenic application but also for a special application such as an artificial satellite. As shown in FIG. 19, the convection-preventing members 9 are disposed at the upper end position and at the lower end position of the heat transfer member 7, both being fixed to the inner peripheral wall of the heat transfer member 7.

As shown in FIG. 20, the convection-preventing members 9 are disposed so as to overhang the inner peripheral side of the heat transfer member 7 in the helium gas release tube 3a. In other words, the convection-preventing members 9 are disposed so as to be able to at least partly overhang inside the helium gas release tube 3a, positioned between the electrodes 8 and the heat transfer member 7. The heat transfer member 7 is a heat sink and the surface thereof is comb-shaped as shown in FIG. 21, thereby having a significantly increased heat dissipation area than in a conventional device. The heat sink has fins, and the fins formed through cutting and raising each are bonded by soldering, or the fins are formed through copper machining.

In the superconducting magnet device with the configuration described above, as shown in FIG. 19, because the convection-preventing members 9 are disposed above and below the heat transfer member 7 that transfers to the gaseous helium 6 the heat transferred from the outside, the gaseous helium 6 can be concentrated around heat sink areas 11 of the heat transfer member 7, and thus the heat exchange amount can be increased. Therefore, the superconducting magnet device according to Embodiment 5 can keep the temperature of the superconducting coil 1 lower than that in a conventional superconducting magnet device, so that consumption of the liquid helium 2 can be reduced.

The gaseous helium 6, avoiding the heat transfer member and passing through the helium gas release tube 3a, is released to the outside of the cryostat 3, namely the outside of the superconducting magnet device, through the pressure valve. Also, the gaseous helium 6 is released by natural convection energized from liquid evaporation, thereby flowing calmly at the speed less than 1 m/s.

Since the helium passage 10 in the helium gas release tube 3a is made narrow by the convection-preventing members 9, in the case where the quench occurs owing to some cause and then a large amount of liquid helium 2 is evaporated, increase of the internal pressure of the superconducting magnet device may cause a breakage of the device. However, because the convection-preventing members 9 are fixed at the upper end position and at the lower end position in the inner peripheral side of the heat transfer member 7, the increased internal pressure lifts the convection-preventing members 9 vertically upward as shown in FIG. 22, so that a comparable flow path width to the conventional device can be obtained. Therefore, even in the case where the quench occurs, pressure increase in the helium gas release tube 3a can be suppressed, so that the breakage of the superconducting magnet device can be avoided.

The present invention is not limited to the specific details and representative embodiments explained and described above. Further modifications and effects that can be easily derived by those of ordinary skill in the art are also included in the present invention. Therefore, various modifications and variations are possible without going beyond the spirit or the scope of comprehensive concept of the present invention defined by the attached claims and their equivalents.

DESCRIPTION OF SYMBOLS

1: coil
2: liquid helium
3: cryostat
3a: helium gas release tube

4: vacuum container
5: heat shield
6: gaseous helium
7: heat transfer member
8: electrode
9: convection-preventing member
10: helium passage
11: heat sink area
12: heat exchange area
A1: flow of helium
A2: flow of heat

The invention claimed is:

1. A superconducting magnet device which generates magnetic force by supplying current to a superconducting coil, the device comprising:
   a vacuum container to contain the superconducting coil and helium for cooling the superconducting coil;
   a release tube to release the helium from inside to outside the vacuum container;
   a convection-preventing member partly fixed inside the release tube to cover a part inside the tube;
   a heat shield to absorb heat transferred from outside to inside the vacuum container; and
   a heat transfer member protruding inside the release tube to transfer heat absorbed by the heat shield to the helium passing inside the release tube,
   wherein the convection-preventing member opens the part inside the release tube depending on pressure change in the release tube,
   the superconducting magnet device includes, in the release tube, an electrode through which the current is supplied to the superconducting coil,
   the electrode is disposed in a center of the release tube,
   the heat transfer member protrudes from an outer peripheral side of the release tube toward the center, and
   the part inside the release tube covered by the convection-preventing member is positioned between the electrode and the heat transfer member.

2. The superconducting magnet device according to claim 1, wherein the heat transfer member further comprises a comb-shaped heat sink with fins.

3. The superconducting magnet device according to claim 1, wherein the heat transfer member further comprises a plurality of openings in a heat exchange area for exchanging heat with the helium passing inside the release tube.

4. The superconducting magnet device according to claim 2, wherein the heat transfer member further comprises a plurality of openings in a heat exchange area for exchanging heat with the helium passing inside the release tube.

5. The superconducting magnet device according to claim 1, wherein the convection-preventing member is elastic.

6. The superconducting magnet device according to claim 2, wherein the convection-preventing member is elastic.

7. The superconducting magnet device according to claim 3, wherein the convection-preventing member is elastic.

8. The superconducting magnet device according to claim 4, wherein the convection-preventing member is elastic.

9. The superconducting magnet device according to claim 1, wherein, when the convection-preventing member covers the part inside the release tube, the helium is guided toward the heat transfer member, and when the convection-preventing member opens the part inside the release tube, the helium is guided to the outside.

10. The superconducting magnet device according to claim 2, wherein, when the convection-preventing member covers the part inside the release tube, the helium is guided toward the heat transfer member, and when the convection-preventing member opens the part inside the release tube, the helium is guided to the outside.

11. The superconducting magnet device according to claim 3, wherein, when the convection-preventing member covers the part inside the release tube, the helium is guided toward the heat transfer member, and when the convection-preventing member opens the part inside the release tube, the helium is guided to the outside.

12. The superconducting magnet device according to claim 4, wherein, when the convection-preventing member covers the part inside the release tube, the helium is guided toward the heat transfer member, and when the convection-preventing member opens the part inside the release tube, the helium is guided to the outside.

13. The superconducting magnet device according to claim 5, wherein, when the convection-preventing member covers the part inside the release tube, the helium is guided toward the heat transfer member, and when the convection-preventing member opens the part inside the release tube, the helium is guided to the outside.

14. The superconducting magnet device according to claim 6, wherein, when the convection-preventing member covers the part inside the release tube, the helium is guided toward the heat transfer member, and when the convection-preventing member opens the part inside the release tube, the helium is guided to the outside.

15. The superconducting magnet device according to claim 7, wherein, when the convection-preventing member covers the part inside the release tube, the helium is guided toward the heat transfer member, and when the convection-preventing member opens the part inside the release tube, the helium is guided to the outside.

16. The superconducting magnet device according to claim 8, wherein, when the convection-preventing member covers the part inside the release tube, the helium is guided toward the heat transfer member, and when the convection-preventing member opens the part inside the release tube, the helium is guided to the outside.

* * * * *